US006772386B2

(12) United States Patent
Iwata et al.

(10) Patent No.: US 6,772,386 B2
(45) Date of Patent: Aug. 3, 2004

(54) DIGITAL SIGNAL PROCESSING METHOD, DATA RECORDING AND REPRODUCING APPARATUS, AND DATA RECORDING MEDIUM THAT ARE RESISTANT TO BURST ERRORS

(75) Inventors: Kazumi Iwata, Kanagawa-ken (JP); Atsushi Hayami, Kanagawa-ken (JP)

(73) Assignee: Victor Company of Japan, Limited, Yokohama (JP)

(*) Notice: Subject to any disclaimer, the term of this patent is extended or adjusted under 35 U.S.C. 154(b) by 419 days.

(21) Appl. No.: 09/956,860

(22) Filed: Sep. 21, 2001

(65) Prior Publication Data

US 2002/0038443 A1 Mar. 28, 2002

(30) Foreign Application Priority Data

Sep. 27, 2000 (JP) .................................... P2000-295116
Nov. 15, 2000 (JP) .................................... P2000-347592

(51) Int. Cl.$^7$ ........................ H03M 13/27; H03M 13/29
(52) U.S. Cl. ..................................................... 714/755
(58) Field of Search ................................. 714/755, 769, 714/761, 762

(56) References Cited

U.S. PATENT DOCUMENTS 4,688,225 A * 8/1987 Fukami et al. .............. 714/755

5,216,656 A * 6/1993 Sako et al. ............... 369/59.25

OTHER PUBLICATIONS

ECMA, Standardizing Information and Communication Systems, "120 mm DVD—Read–Only Disk". Standard ECMA–267, pp. 25–29, Dec. 1997.
Patent Abstracts of Japan, "Interleaving Method and Method for Recording Error Correcting Code Word". Publication No.: 07–230674, date of publication: Aug. 29, 1995.
Patent Abstracts of Japan, "Disc Type Recording Medium and Reproducing Apparatus Therefor". Publication No.: 10–172243, Date of publication: Jun. 26, 1998.

* cited by examiner

*Primary Examiner*—Stephen M. Baker
(74) *Attorney, Agent, or Firm*—Nath & Associates PLLC; Marvin C. Berkowitz; Derek Richmond

(57) ABSTRACT

With two consecutive product-coded ECC blocks, EB1 and EB2, as a set, the rth row of first ECB block EB1 is followed by the rth row of second ECC block EB2 in such a way that the first row of first ECC block EB1 is followed by the first row of second ECB block EB2, which is followed by the second row of first ECC block ECB1, which is followed by the second row of second ECC block EB2, and so on, to interleave data on a row basis. That is, data of two ECC blocks, EB1 and EB2, is allocated alternately on a row basis. This allocation method allows an error to be distributed after reproduction even when a serious burst error extending 18 rows occurs in an ECC block.

5 Claims, 14 Drawing Sheets

DIGITAL SIGNAL PROCESSING METHOD, DATA RECORDING AND REPRODUCING APPARATUS, AND DATA RECORDING MEDIUM THAT ARE RESISTANT TO BURST ERRORS

BACKGROUND OF THE INVENTION

1. Field of the Invention

The present invention relates to a digital signal processing method, a data recording and reproducing apparatus, and a data recording medium, and more particularly to a digital signal processing method, a data recording and reproducing apparatus, and a data recording medium that are suitable for signal processing on a high-density recording medium.

2. Description of the Related Art

Recently, data recording media have become denser. For example, as compared with a CD (Compact Disk), a DVD (Digital Versatile Disk) has a shorter minimum mark length and a higher track density with the track pitch of 0.74 $\mu$m that is shorter than half of that of a CD. The user recording capacity of a single-sided, single-layer DVD is 4.7 GB.

As a replacement of a disk in the current generation in which a red laser beam is used, manufacturers are now studying a next-generation super high-density optical disk that uses a violet laser beam (GaN). The user recording capacity of the next-generation optical disk is said to exceed 20 GB. Naturally, it will have a shorter minimum mark length and a shorter track pitch, each about half of that of the DVD. On such a high-density disk, a defect developed during disk manufacturing or dust or a scratch during use, if any, would be twice as large as that on the DVD in view of the relative data length.

For example, on a DVD, product coding (product coding is a coding of an error correction such as a product error correction coding) is performed for a set of 192×172 DVD data bytes to generate 10 columns of PI parity data for the rows and 16 rows of PO parity data for the columns, as shown in (A) in FIG. 1. As a result, a 208×182 bytes of ECC (Error Correction Code) block is built. Also, as shown in (B) in FIG. 1, one row of PO parity data is inserted every 12 rows to interleave data with PO parity data.

As shown schematically in FIG. 2, the first row to the 208th row of the first ECC block EB1 are written sequentially on a DVD, followed sequentially by the first row to the 208th row of the second ECC block EB2, and so on.

In this method, up to 16 rows may be erasure-corrected with PO parity data. This means that a disk error caused by a continuous disk defect of up to 6 mm in length may be corrected. A continuous error like this is called generally as a burst error. When the linear density is doubled in this format, the maximum length of a correctable defect will be reduced to 3 mm. On the other hand, five symbols (bytes) may be usually corrected with PI parity data and, if there is no random error, the maximum length of a correctable burst error on a DVD is about 10 $\mu$m. Therefore, when the linear density is doubled, the maximum length of a defect correctable with PI parity data will be reduced to 5 $\mu$m.

Therefore, if there is a random error, the length of a burst error correctable with PI and PO parity data becomes much shorter in the conventional digital signal processing method and on the data recording medium described above. It should be noted that DVD PO rows are interleaved with data rows, not to distribute burst errors, but to keep the parity data ratio constant and therefore there is no effect of increasing the correction length.

To solve this problem, the number of parity data units may be increased to make the correction length longer. However, this method is disadvantageous to high-density recording because parity data redundancy in the ECC block increases.

SUMMARY OF THE INVENTION

In view of the foregoing, it is an object of the present invention to provide a digital signal processing method, a data recording and reproducing apparatus, and a data recording medium capable of increasing the maximum burst-error correctable length relatively easily without increasing redundancy.

It is another object of the present invention to provide a digital signal processing method, a data recording and reproducing apparatus, and a data recording medium capable of distributing relatively short burst errors and thereby increasing the data linear density.

To solve the above problems, there is provided a digital signal processing method for recording and reproducing digital signals of data to and from a recording medium on an ECC block basis, the ECC block including a predetermined number of words of digital signals and parity data generated by product-coding the predetermined number of words of digital signals, wherein, with two consecutive ECC blocks as a set, a sequence of operations is repeated for all rows of the two ECC blocks of the set, the sequence of operations being executed in such a way that positions of an odd-numbered data unit in a first row of one of the ECC blocks of the set and an even-numbered data unit in a first row of the other ECC block are exchanged on a data unit basis and recorded on the recording medium and then positions of an even-numbered data unit in the first row of one of the ECC block and an odd-numbered data unit in the first row of the other ECC block are a exchanged on a data unit basis and recorded on the recording medium.

To solve the above problems, there is provided a data recording and reproducing apparatus that records and reproduces digital signals of data to and from a recording medium on an ECC block basis, the ECC block including a predetermined number of words of digital signals and parity data generated by product-coding the predetermined number of words of digital signals, the apparatus comprising: ECC block generating means for generating ECC blocks by a product-coding method, each ECC block including a predetermined number of words of main data, auxiliary information including a sector address, and parity data: interleaving means for sequentially outputting, with n (n≧2) consecutive ECC blocks as a set, kth rows and then (k+1)th rows of the ECC blocks of the set in such a way that first rows of the ECC blocks of the set are output sequentially and then second rows are output sequentially, the consecutive ECC blocks being included in the ECC blocks generated by the ECC block generating means; recording means for recording signals, output by the interleaving means, on the recording medium with frame sync codes attached; reproducing means for reproducing the signals from the recording medium; de-interleaving means for de-interleaving the signals reproduced by the reproducing means based on the sector addresses and for outputting the ECC blocks arranged in an original order; and decoding means for decoding the main data using data in the ECC blocks obtained by the de-interleaving means, wherein; the ECC block generating means sequentially generates a plurality of ECC blocks each composed of a predetermined number of words and each comprising a plurality of divided data sectors each being one of two M×(N/2) data sectors generated by dividing an M×N data sector composed of the main data and the auxiliary information, into two in a column direction; a predetermined number of bytes of first parity data generated from row-direction elements of the plurality of divided data sectors; and a predetermined number of bytes of second parity data generated from column-direction elements of the plurality of divided data sectors, the first parity data or the second parity data being generated from the row-direction elements of the second parity data or the column-direction elements of the first parity data, with two consecutive ECC blocks, generated by the ECC block generating means, as a set, the interleaving means sequentially outputs kth rows, and then sequentially outputs (k+1)th rows, of two divided data sectors corresponding to each of the ECC blocks in such a way that each of first rows of the two divided data sectors, each belonging to one of the ECC blocks of the set, and corresponding first parity data are output sequentially and then each of second rows is output sequentially and, each time M rows of the two divided data sectors are output, the second parity data is output alternately for one and the other of the two ECC blocks alternately, and the recording means records the signals, output by the interleaving means, with the frame sync codes attached at a regular interval.

To solve the above problems, there is provided a data recording and reproducing apparatus that records and reproduces digital signals of data to and from a recording medium on an ECC block basis, the ECC block including a predetermined number of words of digital signals and parity data generated by product-coding the predetermined number of words of digital signals, the apparatus comprising: ECC block generating means for generating ECC blocks by a product-coding method, each ECC block including a predetermined number of words of main data, auxiliary information including a sector address, and parity data; interleaving means for sequentially outputting, with n (n≧2) consecutive ECC blocks of the set, kth rows and then (k+1)th rows of the ECC blocks of the set in such a way that first rows of the ECC blocks of the set are output sequentially and then second rows are output sequentially, the consecutive ECC blocks being included in the ECC blocks generated by the ECC block generating means; recording means for recording signals, output by the interleaving means, on the recording medium with frame sync codes attached; reproducing means for reproducing the signals from the recording medium; de-interleaving means for de-interleaving the signals reproduced by the reproducing means based on the sector addresses and for outputting the ECC blocks arranged in an original order; and decoding means for decoding the main data using data in the ECC blocks obtained by the de-interleaving means, wherein; the ECC block generating means sequentially generates a plurality of ECC blocks each composed of a predetermined number of words and each comprising a plurality of divided data sectors each being one of two M×(N/2) data sectors generated by dividing an M×N data sector composed of the main data and the auxiliary information, into two in a column direction; a predetermined number of bytes of first parity data generated from row-direction elements of the plurality of divided data sectors; and a predetermined number of bytes of second parity data generated from column-direction elements of the plurality of divided data sectors, the first parity data or the second parity data being generated from row-direction elements of the second parity data or column-direction elements of the first parity data, and with two consecutive ECC blocks, generated by the ECC block generating means, as a set, the interleaving means sequentially outputs kth rows, and then sequentially outputs (k+1)th rows, of two divided data sectors corresponding to each of the ECC blocks in such a way that each of first rows of the two divided data sectors, each belonging to one of the ECC blocks of the set, and corresponding first parity data are output sequentially and then each of second rows is output sequentially and, each time (2×M) rows of the two divided data sectors are output, the second parity data is output for the two ECC blocks.

To solve the above problems, there is provided a data recording and reproducing apparatus that records and reproduces digital signals of data to and from a recording medium on an ECC block basis, the ECC block including a predetermined number of words of digital signals and parity data generated by product-coding the predetermined number of words of digital signals, the apparatus comprising: ECC block generating means for generating ECC blocks by a product-coding method, each ECC block including a predetermined number of words of main data, auxiliary information including a sector address, and parity data; interleaving means for repeating, with two consecutive ECC blocks as a set, a sequence of operations for all rows of the two ECC blocks of the set, the sequence of operations being executed in such a way that positions of an odd-numbered data unit in a first row of one of the ECC blocks of the set and an even-numbered data unit in a first row of the other ECC block are exchanged on a data unit basis and then positions of an even-numbered data unit in the first row of one of the ECC block and an odd-numbered data unit in the first row of the other ECC block are exchanged on a data unit basis; recording means for recording signals, output by the interleaving medium, on the recording means with frame sync codes attached; reproducing means for reproducing the signals from the recording medium; de-interleaving means for de-interleaving the signals reproduced by the reproducing means based on the sector addresses and for outputting the ECC blocks arranged in an original order; and decoding means for decoding the main data using data in the ECC blocks obtained by the de-interleaving means.

To solve the above problems, there is provided a recording medium on which digital signal of data are recorded on an ECC block basis, the ECC block being generated by product-coding a predetermined number of words of digital signals and parity data, wherein, with two consecutive ECC blocks as a set, a sequence of operations is repeated for all rows of the two ECC blocks of the set, the sequence of operations being executed in such a way that an odd-numbered data unit in a first row of one of the ECC blocks of the set and an even-numbered data unit in a first row of the other ECC block are alternately switched on a data unit basis and then an even-numbered data unit in the first row of one of the ECC block and an odd-numbered data unit in the first row of the other ECC block are alternately switched on a data unit basis.

Even when an error occurs in an ECC block at reproduction time, the error occurrence positions of the reproduced signals after de-interleaving may be at least a predetermined distance apart.

The nature, principle and utility of the invention will become more apparent from the following detailed description when read in conjunction with the accompanying drawings.

DESCRIPTION OF THE PREFERRED EMBODIMENTS

Next, some embodiments according to the present invention will be described below with reference to the drawings.
<First Embodiment>

Figure 3:
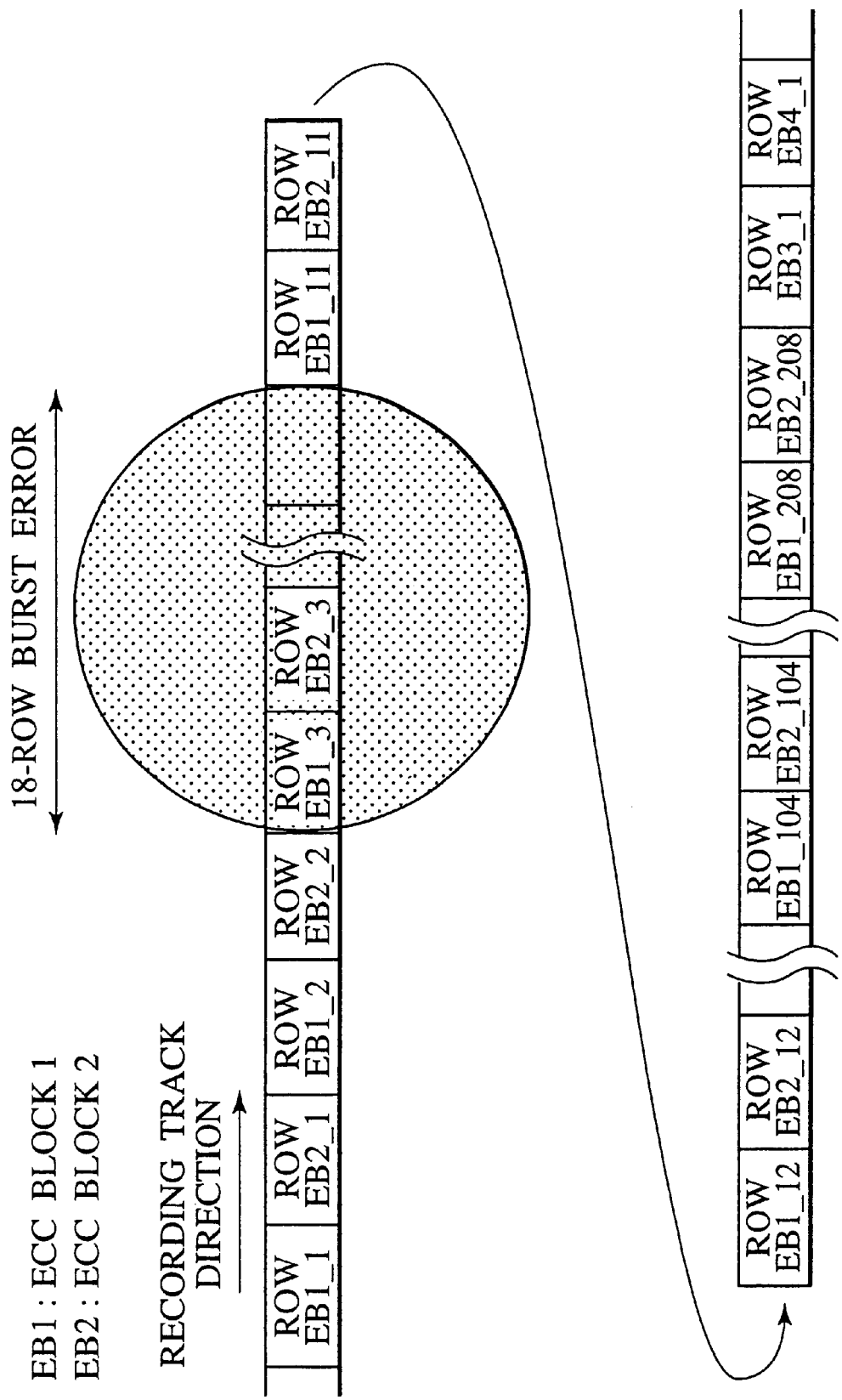
FIG. 3 is a diagram showing data allocation on a data recording medium in a first embodiment of the present invention.

FIG. 3 shows the layout of data on a data recording medium in a first embodiment according to the present invention. In this embodiment, an interleave method is used in which data, which is error-correction-coded by the product coding method, is distributed on a recording medium. As shown in FIG. 3, with two consecutive product-coded ECC blocks, EB1 and EB2, as a set, the first row of the first ECC block EB1 is followed by the first row of the second ECC block EB2, which is followed by the second row of the first ECC block EB1, which is followed by the second row of the second ECC block EB2, and so on. That is, the rth row of the first ECC block is followed by the rth row of the second ECC block EB2. In this way, data is interleaved on a row basis.

Figure 1:
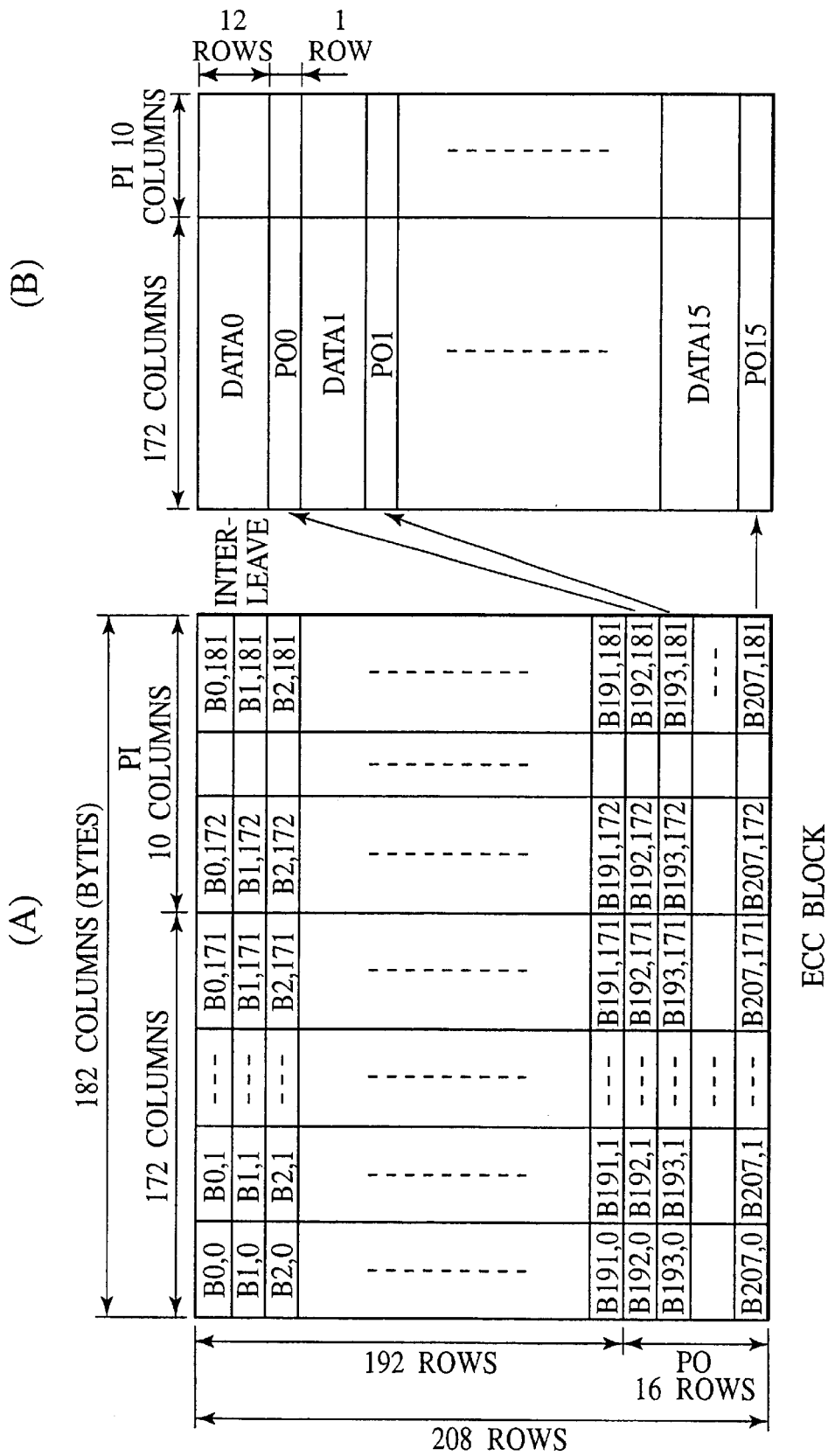
FIG. 1 is a diagram showing the configuration of an ECC block in a conventional method.

That is, in this embodiment, data in two ECC blocks, EB1 and EB2, are alternated on a row basis. The two ECC blocks, EB1 and EB2, are each configured as a product code block shown in FIG. 1. In addition, like a DVD, one PO parity row is inserted every 12 rows of data to keep the ratio of parity data in one sector constant.

Figure 4B:
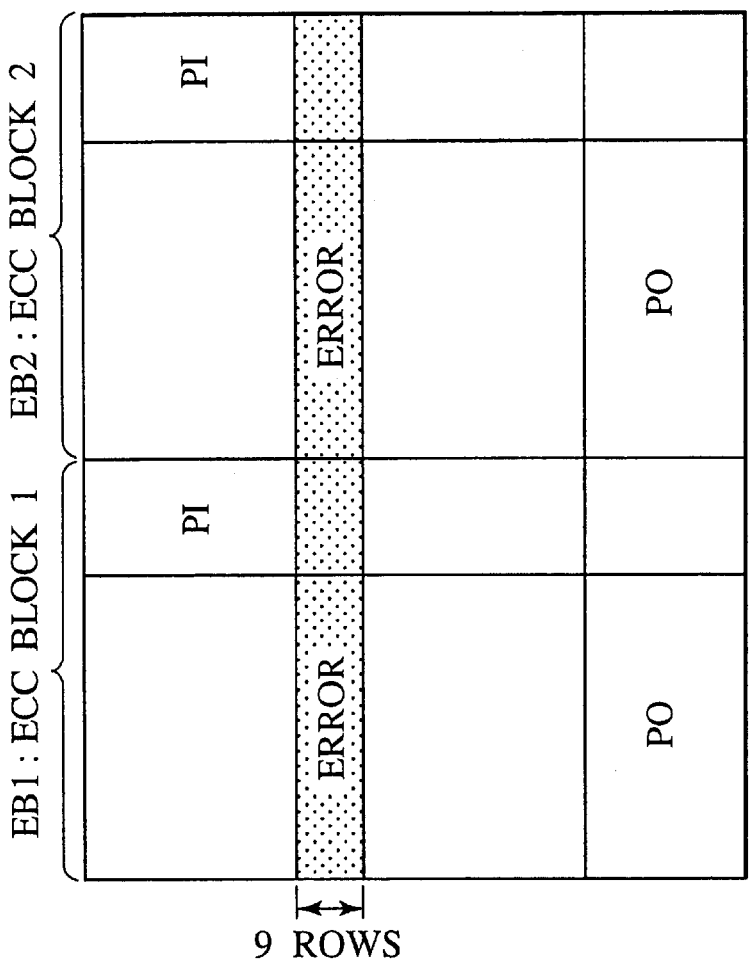
FIG. 4B is a diagram showing the distribution of an error in the ECC blocks after de-interleaving at reproduction time in the first embodiment of the present invention.

Assume that a serious burst error has occurred, for example, in consecutive 18 rows in the ECC blocks in this embodiment as shown in FIG. 3. At reproduction time, the error is distributed between two ECC blocks after de-interleaving as shown in FIG. 4B. That is, the error is in nine rows in the first ECC block EB1 and in nine rows in the second ECC block EB2.

Figure 2:
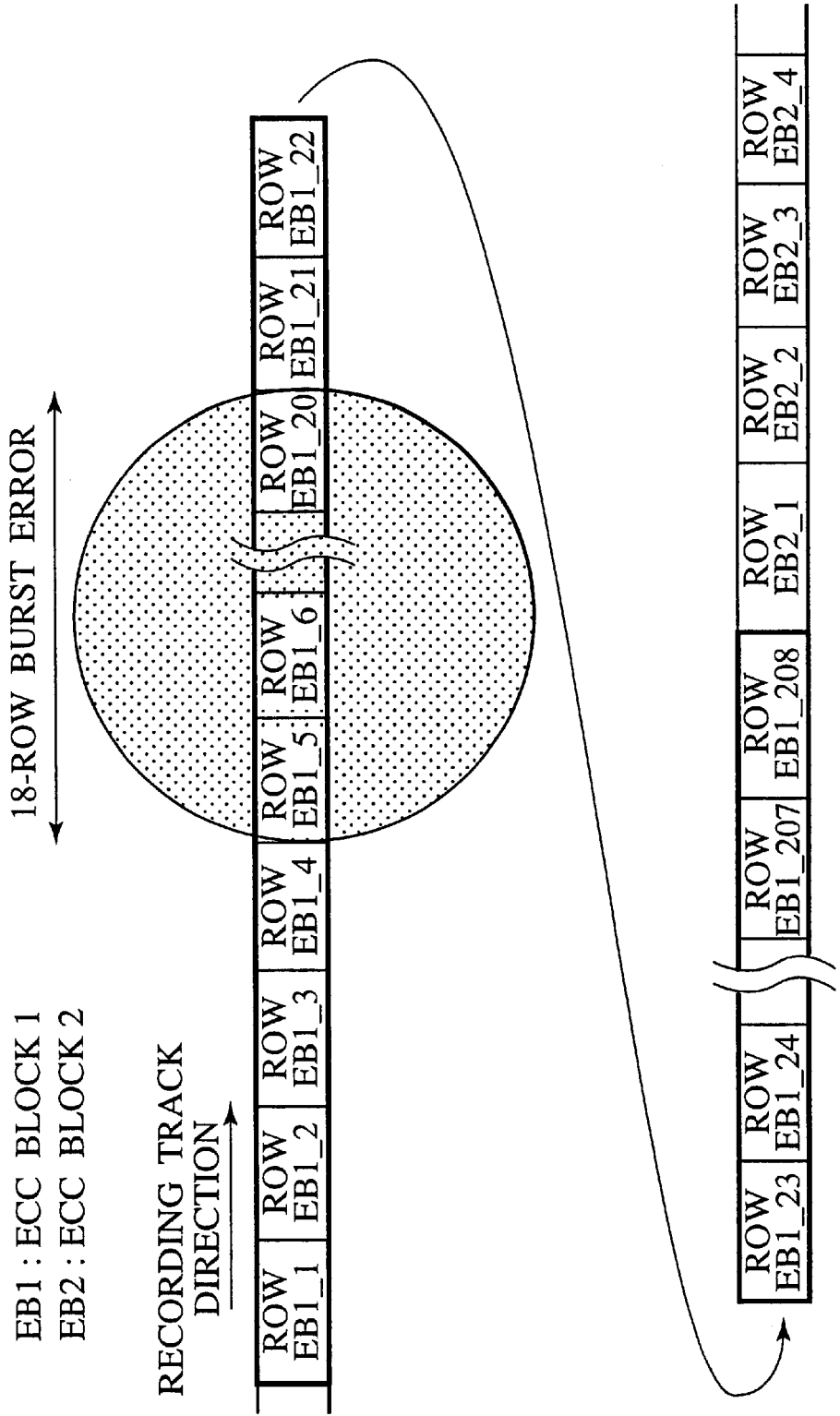
FIG. 2 is a diagram showing an example of data allocation on a conventional data recording medium.
Figure 4A:
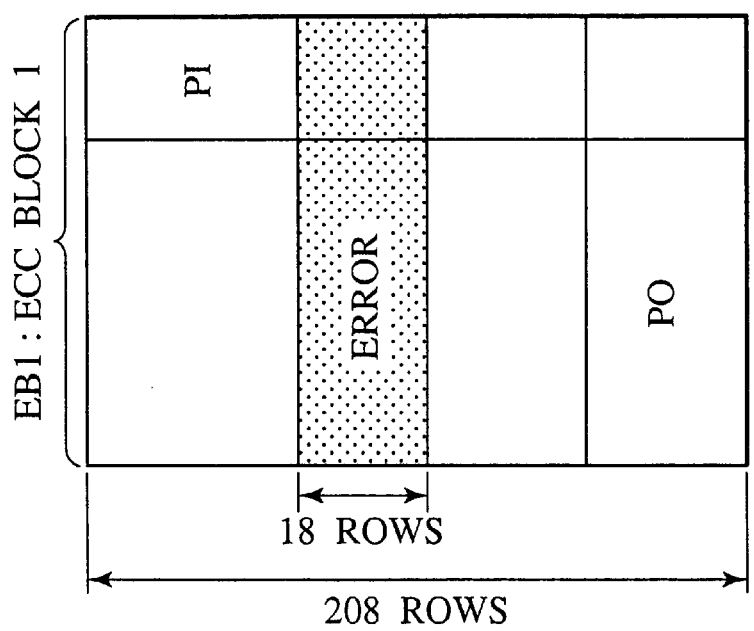
FIG. 4A is a diagram showing the distribution of an error in the ECC blocks after de-interleaving at reproduction time in the conventional method.

On the other hand, assume that the same burst error described above has occurred in consecutive 18 rows in the first ECC block as shown in FIG. 2 on the conventional recording medium shown in FIG. 2. At reproduction time, the error is in the ECC block after de-interleaving as shown in FIG. 4A. That is, the error is in consecutive 18 rows of the ECC block EB1.

Although there is a slight difference in the error distribution ratio depending upon the burst error start and end positions in the rows where the burst error has occurred, the error processed by the method in this embodiment shown in FIG. 4B is distributed more widely than the error processed by the conventional method shown in FIG. 4A, as indicated by comparison between FIG. 4A and FIG. 4B. The result is that the effect of errors is diminished to ½. That is, although the error is not distributed in each row and the correction length is not increased in this embodiment, the number of rows affected by the error in each column is reduced to ½ of that in the conventional method.

In this case, an erasure-correction with PO parity data cannot be made in the conventional method shown in FIG. 4A, because the maximum number of correction rows of 16 is exceeded. On the other hand, the number of error rows in each ECC block in this embodiment is nine as shown in FIG. 4B. Because the maximum number of correction rows of 16 is not exceeded, the error may be corrected. The burst error correction limit in the conventional method is about 3 mm that corresponds to 16 rows if the recording linear density of a DVD is doubled, whereas the burst error correction limit in the method according to the present invention is about 6 mm as on a DVD. If the recording linear density is the same as that of a DVD, about 12 mm of a burst error may be corrected. That is, the correction length may be doubled without increasing redundancy.

With n (n≧2) consecutive produce code blocks (ECC blocks) as a set, the rth rows of the first to nth ECC blocks may also be sequentially arranged. In this case, a serious burst error is distributed among n ECC blocks. The effect of an error in one ECC block is reduced to 1/n as compared with that in the conventional method, and the burst correction length may be increased to n times.

Figure 5:
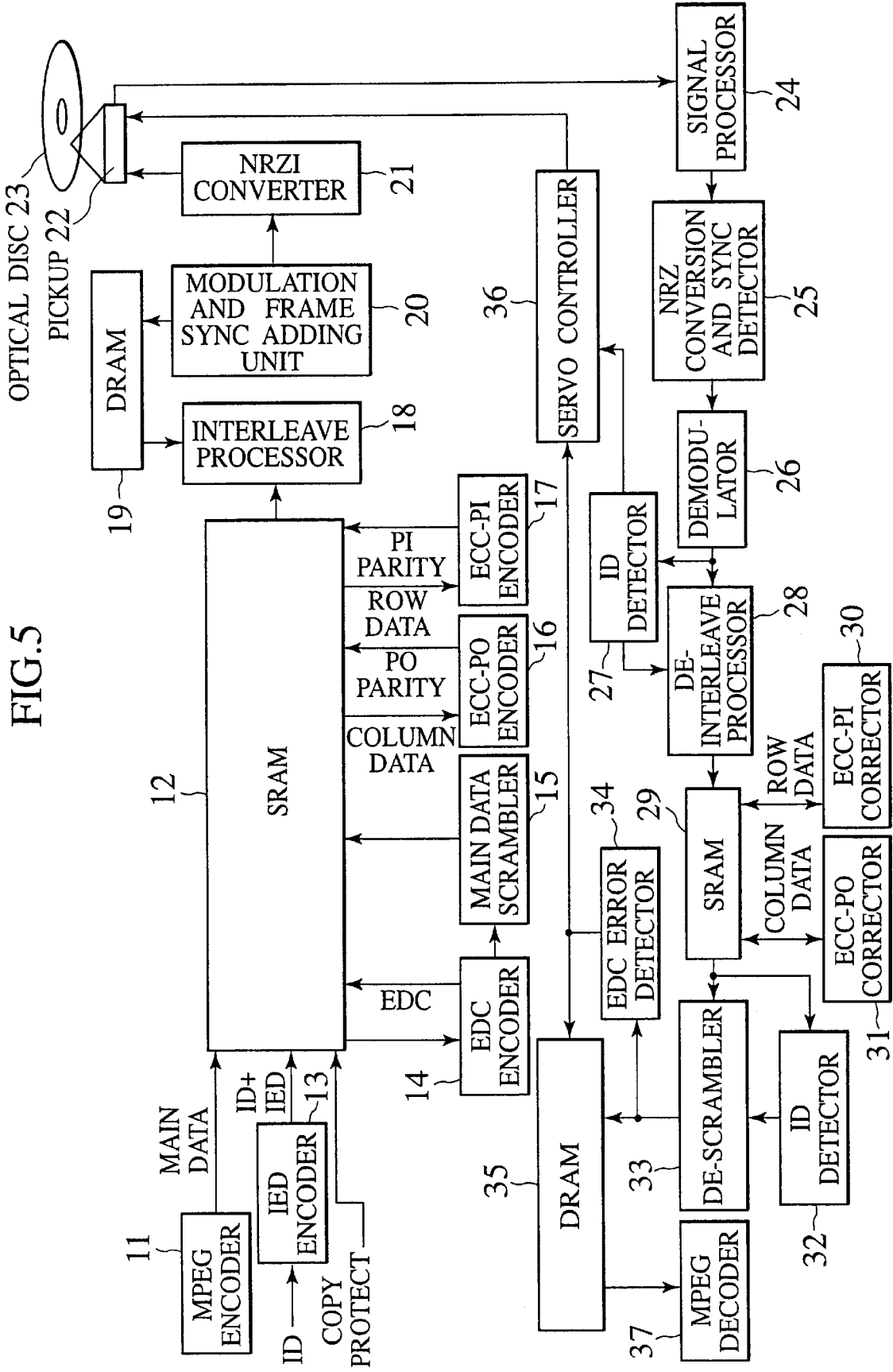
FIG. 5 is a block diagram of an embodiment of a data recording and reproducing apparatus according to the present invention.

Next, a data recording and reproducing apparatus according to the present invention will be described. FIG. 5 is a block diagram showing an embodiment of the data recording and reproducing apparatus of the present invention. In this embodiment, the present invention is applied to a DVD recording and reproducing apparatus. First, the configuration and the operation of the recording system will be described. An MPEG encoder 11 compresses and encodes video data and audio data using the MPEG standard, which is known, and sends the encoded data to a static random access memory (SRAM) 12 as main data.

At the same time, a four-byte ID, composed of a low-order three-byte sector address and high-order one-byte disk information data, is sent to an IED encoder 13. This encoder adds a two-byte ID error correction parity IED to the ID and then sends it to the SRAM 12. The IED is generated using RS (6, 4, 3). RS (a, b, c) is a Reed Solomon code where a is the code word length, b is the number of data units, and c is the minimum code-to-code distance.

The SRAM 12 receives the main data, ID and IED, and six-byte copy protect information CP, temporarily stores them, reads a total of 2060 bytes composed of 2048-byte main data, ID, IED, and CP, and sends them to an EDC encoder 14. This encoder generates an error detection parity code (EDC: error detection code). A CRC (Cyclic Redundancy Code) is used to generate an EDC. The generated EDC is written in the SRAM 12.

The 2064-byte data, composed of the EDC generated by the EDC encoder 14 and the 2060-byte data described above, is sent to a main data scrambler 15. This scrambler uses sector addresses to scramble only the 2048-byte main data. The detail of the scramble method is not described here because it is not related directly to the present invention. The scrambled data, that is, 2048-byte scrambled main data, is written in the SRAM 12. In the memory map of the SRAM 12, the addresses are allocated as indicated by the map in (A) in FIG. 6. At this time, an area is reserved for later use in ECC parity data generation.

Figure 7:
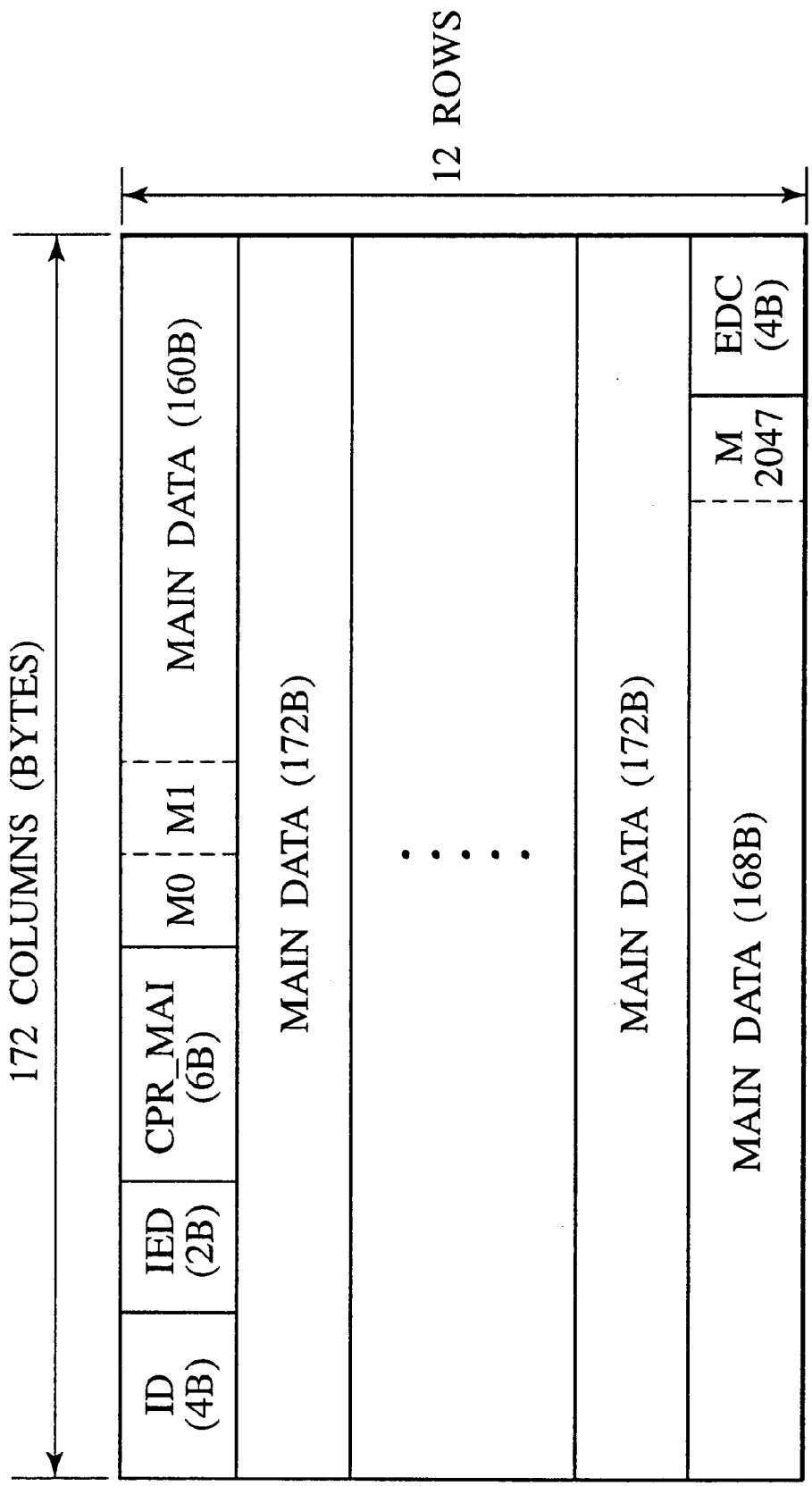
FIG. 7 is a diagram showing the configuration of a data sector on a DVD.

The 2064-byte data described above, called a data sector on a DVD, is composed of 172 columns (bytes)×12 rows as shown in FIG. 7. The low-order three bytes of the first four-byte ID contain a sector address, which is incremented by one for each consecutive data sector. In FIG. 7, "CPR_MAI" indicates the copy protect information CP described above. "M0", "M1", and "M2047" indicate the first byte, second byte, and 2048th byte of the main data, respectively.

Figure 6:
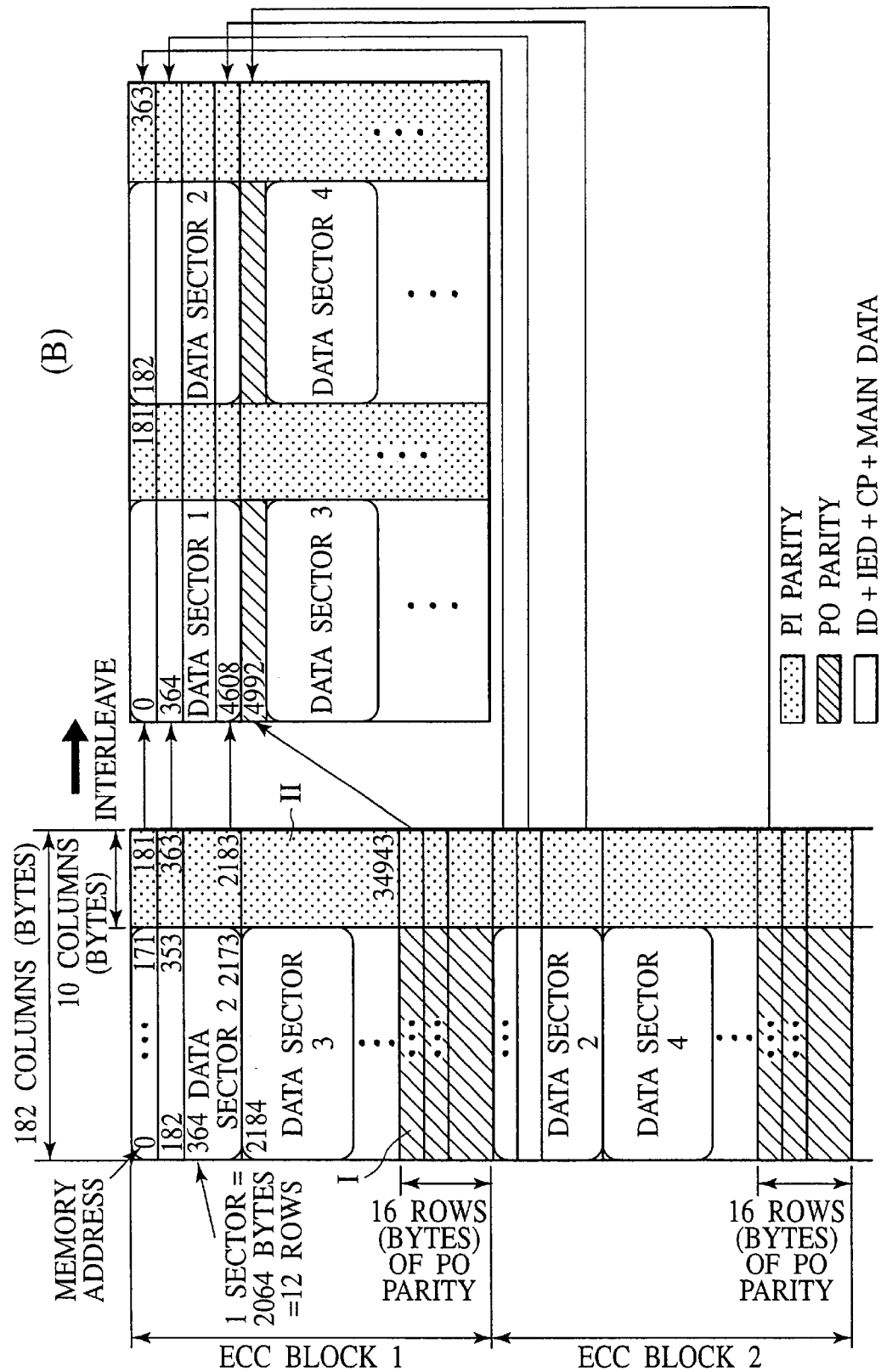
FIG. 6 is a diagram showing an example of a memory map of two memories, one before interleaving and the other after interleaving, of the recording system in FIG. 5.

In the SRAM 12, the 2064-byte data described above is allocated alternately, on a data sector basis, as shown in (A) in FIG. 6. This configuration sequentially arranges the sector numbers on the memory map in a DRAM 19, that is, the sector numbers written on the disk. Even if a part of sector addresses cannot be read due to a defect at reproduction time that will be described later, this configuration assures sector address continuity and therefore makes it possible to predict an address that cannot be read. To allow the start of an ECC block, which will be generated later, to be identified at reproduction time, the low-order five bits of the sector address in data sector 1 of ECC block 1 in (A) in FIG. 6 must always be set to "00000B".

When 32 data sectors are accumulated in the SRAM 12 in this way, a total of 16 odd-numbered data sectors, that is, 172 columns (bytes)×192 rows, are accessed in the column direction in the SRAM map shown in (A) in FIG. 6 and are passed to an ECC-PO encoder 16. Using RS (208, 192, 17), this encoder generates 16 bytes of PO parity data (outer parity) and writes it in the PO parity area in the SRAM 12. This processing is performed for the 172 columns to accumulate the generated parity data in the PO parity area indicated by I in the memory map of SRAM 12 shown in (A) in FIG. 6.

Next, 172 bytes of data are accessed in the row direction of the SRAM map in (A) in FIG. 6 and are passed to an ECC-PI encoder 17. Using RS (182, 172, 11), this encoder generates 10 bytes of PI parity data (inner parity) and writes it in the PI parity area in the SRAM 12. This processing is performed for the 208 rows (=192 rows+16 rows) to accumulate the generated parity data in the PI parity area indicated by II in the memory map of SRAM 12 shown in (A) in FIG. 6. This 182×208 block forms ECC block 1.

Similarly, for the even-numbered 16 data sectors out of 32 sectors accumulated in the SRAM 12, that is, 172 columns× 192 rows data, PO parity data and PI parity data, which are product code, are generated and written in the SRAM 12. In the memory map of the SRAM 12, 182×208 ECC block 2 is accumulated as shown in (A) in FIG. 6. It should be noted that, when the product code described above is used, 192 rows of PI parity data may be generated first and then 182 columns of PO parity data may be generated.

Next, an interleave processor 18 accesses data in the SRAM 12 in the order in which data is actually recorded on an optical disk 23, that is, reads data while interleaving, and writes it in the DRAM 19. That is, from the SRAM 12, the interleave processor 18 reads 182 bytes from the first row of the first ECC block 1, then 182 bytes from the first row of the second ECC block 2, then 182 bytes from the second row of the first ECC block 1, then 182 bytes from the second row in the second ECC block 2, and so on, alternately between two ECC blocks.

The PO parity rows of the two ECC blocks are read for each sector of each ECC block. For example, after the last row (that is, 12th row) of the first sector of the second ECC block 2 is read, the first PO parity row of the first ECC block 1 is read and then the first PO parity row of the second ECC block 2 is read. In this way, after each two sectors are read, the PO parity rows are read sequentially from the two ECC blocks, one row from each ECC block.

The data and parity data read by the interleave processor 18 from the SRAM 12 are written in the dynamic random access memory (DRAM) 19. Therefore, the memory map of the DRAM 19 is as shown in (B) in FIG. 6. In this way, data is accumulated in the DRAM 19 in the same order in which data is allocated on the disk shown in FIG. 3.

Note that the DRAM 19 is provided to adjust the difference between the rate at which data is transferred from the MPEG encoder 11 and the rate at which data is transferred to the optical disk 23 for writing. In this case, the rate at which data is transferred to the optical disk 23 is set higher than the rate at which data is transferred from the MPEG encoder 11. This transfer rate setting makes data-read transfer from the DRAM 19 higher than data-write transfer to the DRAM 19. Therefore, the DRAM 19 never becomes full, and data sent from the MPEG encoder 11 is never discarded.

When the DRAM 19 becomes empty, the drive stops writing to the optical disk 23 (reading from the DRAM 19) and waits for data to be accumulated in the DRAM 19. In general, the drive enters the still state (one track back jump per rotation of the spindle motor, not shown, that rotates the optical disk 23). When data is accumulated in the DRAM 19 to some degree, the drive resumes writing data on the optical disk 23 from the point at which writing to the optical disk 23 stopped.

A modulation and frame sync adding unit 20 reads data and parity data sequentially from the DRAM 19, shown in (B) in FIG. 6, from left to right and from top to bottom and modulates the data (8/16 modulation in the case of DVD). The unit also adds a frame sync code, which will be used for synchronizing data at reproduction time, every 91 bytes and sends the data to an NRZI converter 21.

The NRZI converter 21 NRZI-converts (the state is inverted by a logical value "1") the input signal, sends the converted signal to a pickup 22, modulates the intensity of a laser beam emitted from the laser beam source within the pickup 22, focuses the modulated laser beam on the optical disk 23 (writable DVD), which is rotated by a spindle motor not shown, and records the data on the disk. Therefore, the rows are recorded on the optical disk 23 alternately from two ECC blocks, EB1 and EB2, as shown in FIG. 3. After ECC block EB2, the rows from EB3 and EB4 are alternately written. Thereafter, the rows from two consecutive ECC blocks are recorded similarly.

Although data is interleaved when read from the SRAM 12 in the above description, data may also be interleaved when written into the DRAM 19. In addition, data may be interleaved when written into the SRAM 12, and the EDCs and ECCs may be generated by reading the data while de-interleaving it.

In addition, though two memories (SRAM 12 and DRAM 19) are used, only the DRAM may be used. In this case, data is interleaved when writing data to, or reading data from, the DRAM. For example, data is written as shown in the DRAM map in (B) in FIG. 6, and such operations as EDC generation, data scrambling, and ECC generation are performed while accessing the DRAM. Then, data is read sequentially beginning from the first row and then written on the optical disk 23.

Next, the configuration and the operation of the reproduction system will be described. The pickup 22 focuses a predetermined-intensity laser beam onto the optical disk 23 rotated by the spindle motor not shown. A light reflected on the signal recording surface of the optical disk 23 is sent to the pickup 22 and is photo-electrically converted. The obtained read signal is sent to a signal processor 24, which performs signal processing (PF amplification, shaping, bit PLL) for the signal. The bit clock extracted through bit PLL is sent to an NRZ conversion and sync detector 25, which NRZ-converts the signal based on the bit clock and detects the frame sync code to find the data byte delimiter (that is, establishes frame synchronization).

As will be described later, when establishing frame synchronization, the NRZ conversion and sync detector 25 establishes frame synchronization first and then sector synchronization. The reproduced signal, for which frame synchronization and sector synchronization have been established in this manner, is sent to a demodulator 26 (8/16 demodulation) for demodulation and then sent to an ID detector 27 and a de-interleave processor 28. Note that the ID in the signal output from the demodulator 26 includes a three-bit sector address. This sector address is incremented by one for each of 16 sectors of an ECC block and is initialized for each ECC block.

The ID detector 27 detects the ID in the reproduced signal and sends the sector address included in the ID to a servo controller 36 for use in the drive seek operation. If the reproduced signal is sent from an address on the optical disk 23 not desired by the user, the servo controller 36 performs seek operation in which the pickup 22 is moved to a desired sector address on the optical disk 23. On the other hand, if the address is a desired sector address, the de-interleave processor 28 writes the reproduced signal in an SRAM 29 while de-interleaving data.

Based on the sector address sent from the ID detector 27, the de-interleave processor 28 detects the start (ECC block sync code) of the ECC block in the demodulated signal sent from the demodulator 26 and determines which of the two consecutive ECC blocks the received ECC block is. Then, the de-interleave processor 28 writes data into the SRAM 29 while addressing (de-interleaving) data such that the data is allocated in the same manner as in the memory map in (A) in FIG. 6.

Note that the de-interleave processor writes data into the SRAM 29, beginning with the first sector of the first ECC block of the two ECC blocks. This is because an ECC block is not completed and an error cannot be corrected unless there are two consecutive ECC blocks. The first sector of the two ECC blocks is determined by checking if the low-order five bits contain "00000B".

Each time at least one row (182 bytes) of data is accumulated in the SRAM 29, an ECC-PI corrector 30 reads the data from the SRAM 29 in the row direction, corrects an error with PI parity data if any, and writes corrected data into the SRAM 29. After PI correction is made for all rows in the two consecutive ECC blocks and corrected data is written in the SRAM 29, an ECC-PO corrector 31 starts PO correction.

The ECC-PO corrector 31 reads 208 bytes of data of an ECC block from the SRAM 29 in the column direction of the memory map to perform PO correction with PO parity data. After PO correction is made for all columns (that is, 182 bytes), an ID detector 32 and a de-scrambler 33 sequentially access 2064 bytes, composed of the ID, IED, CP, main data, and EDC parity data, and reads them from the SRAM 29.

The ID detector 32 detects the ID again from the data read from the SRAM 29 and sends the sector address to the de-scrambler 33. The de-scrambler 33 uses the sector address, received from the ID detector 32, to de-scramble 2048 bytes of main data included in the data read from the SRAM 29. Data de-scrambled by the de-scrambler 33 is sent to an EDC error detector 34, which uses the EDC to check to see if there is an error.

In response to a detection result from the EDC error detector 34 indicating that there is no error, a DRAM 35 writes therein the data de-scrambled by the de-scrambler 33. On the other hand, in response to a detection result from the EDC error detector 34 indicating that there is an error, the DRAM 35 does not write the data de-scrambled by the de-scrambler 33. Then, the EDC error detector 34 sends an instruction to the servo controller 36 to read the same data again from the optical disk 23. The servo controller 36 moves the pickup 22 to access a desired sector address again. This operation is called generally as a retry.

Actually, when the EDC error detector 34 detects an error with the use of the EDC, one sector of de-scrambled data is already written in the DRAM 35. Therefore, if an error is detected, the address pointer of the DRAM 35 must be backspaced one sector. The data written in the DRAM 35 is read sequentially by an MPEG decoder 37 and is de-compressed according to the MPEG standard for generating the video signal and the audio signal. Note that de-interleaving may also be performed after reading data from the SRAM 29.

In the above description, an ECC block is composed of a plurality of data sectors. As will be described, each data sector may also be divided for distribution between two ECC blocks. As shown in (A) in FIG. 9, one 6×344 data sector may be divided into two in the column direction. That is, as shown in (A) in FIG. 9, the 12×172 data sector shown in FIG. 7 is divided into two: a 6×172 first divided data sector (ith data sector is i_1) composed only of odd-numbered rows and a 6×172 second divided data sector (ith data sector is i_2) composed only of even-numbered rows.

Those data sectors are distributed in such a way that a divided data sector on the left-hand side belongs to ECC block 1 and a divided data sector on the right-hand side belongs to ECC block 2. When representing the allocation as in the example described above, the data sectors are allocated as shown in (A) in FIG. 10. In this allocation, the data sector allocation is different from that shown in (B) in FIG. 6 but the memory address allocation is the same. In this case, the data sector allocation is as shown in (B) in FIG. 11. The memory map before interleaving is shown in (A) in FIG. 11.

Figure 11:
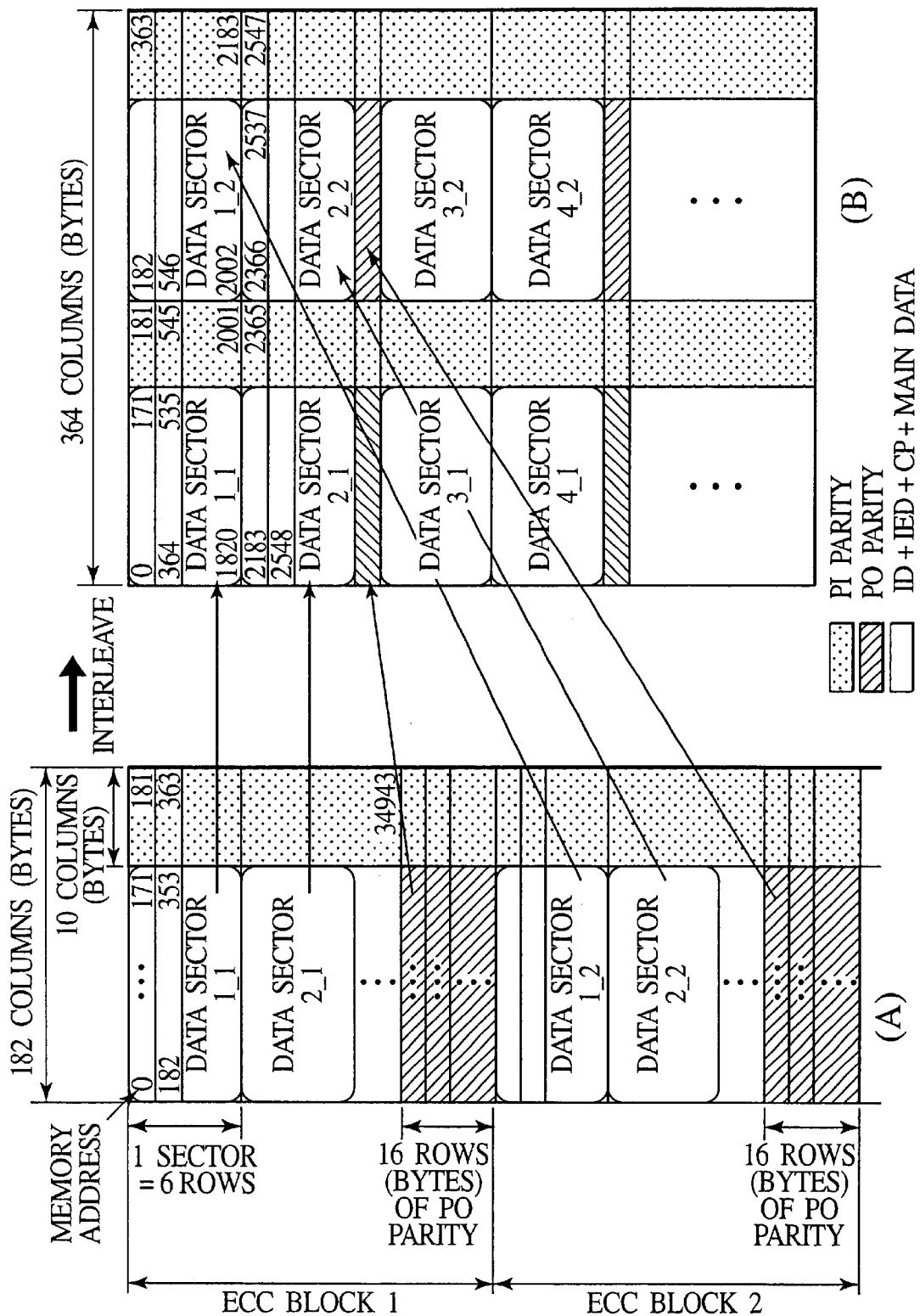
FIG. 11 is a diagram showing still another example of a memory map of two memories, one before interleaving and the other after interleaving, of the recording system in FIG. 5.

In the example in (B) in FIG. 11, each time 12 rows (=2×6 rows) are output from each two divided data sectors, the PO parity rows, one for each of ECC blocks 1 and 2, are output. This output method orderly places main data on the recording medium, making memory access at reproduction time easy.

More generally, a data sector, given as M×N, is divided into two in the column direction to generate a first divided data sector and a second divided data sector, each composed of M rows and N/2 columns. They are distributed between two ECC blocks. And, when data is interleaved, the PO rows, one for each ECC block, are inserted each time (M×2) rows are output from the first divided data sector and the second divided data sector (each two data sectors). In other words, a data sector, given as R(=M×2)×C(=N/2), is divided into two to generate an (R/2)×C first divided data sector composed of odd-numbered rows and an (R/2)×C second divided data sector composed of even-numbered rows. They are distributed between two ECC blocks. When data is interleaved, the PO rows, one for each ECC block, are inserted each time R rows are output from the first divided data sector and the second divided data sector (each two data sectors).

Next, a frame sync code recording and reproducing method in this embodiment will be described more in detail. The NRZ conversion and sync detector 25 counts the number of bits beginning at the position where a frame sync code is detected to predict the next frame sync code position. If the next frame sync code does not appear within several bits before and after the predicted position, the NRZ conversion and sync detector 25 inserts a pseudo frame sync code at the predicted position to prevent a condition in which the frame sync code cannot be read due to a defect.

For example, assume that two consecutive frame sync codes can be detected. In this case, an attempt is made to establish sector synchronization assuming that frame synchronization has been established. On a conventional DVD, the first frame sync code in each sector is a unique code that is different from that of other frame sync codes. This frame sync code is called SY0. This SY0 appears at a fixed interval of 26 sync frames. The NRZ conversion and sync detector 25 uses SY0, which is detected normally at reproduction time, to predict the next SY0. This is done simply by counting 26 frame sync codes to check to see if the next SY0 appears. Because SY0 appears every 26 sync frames as described above, the next SY0 may be predicted simply by counting sync frames.

Figure 8:
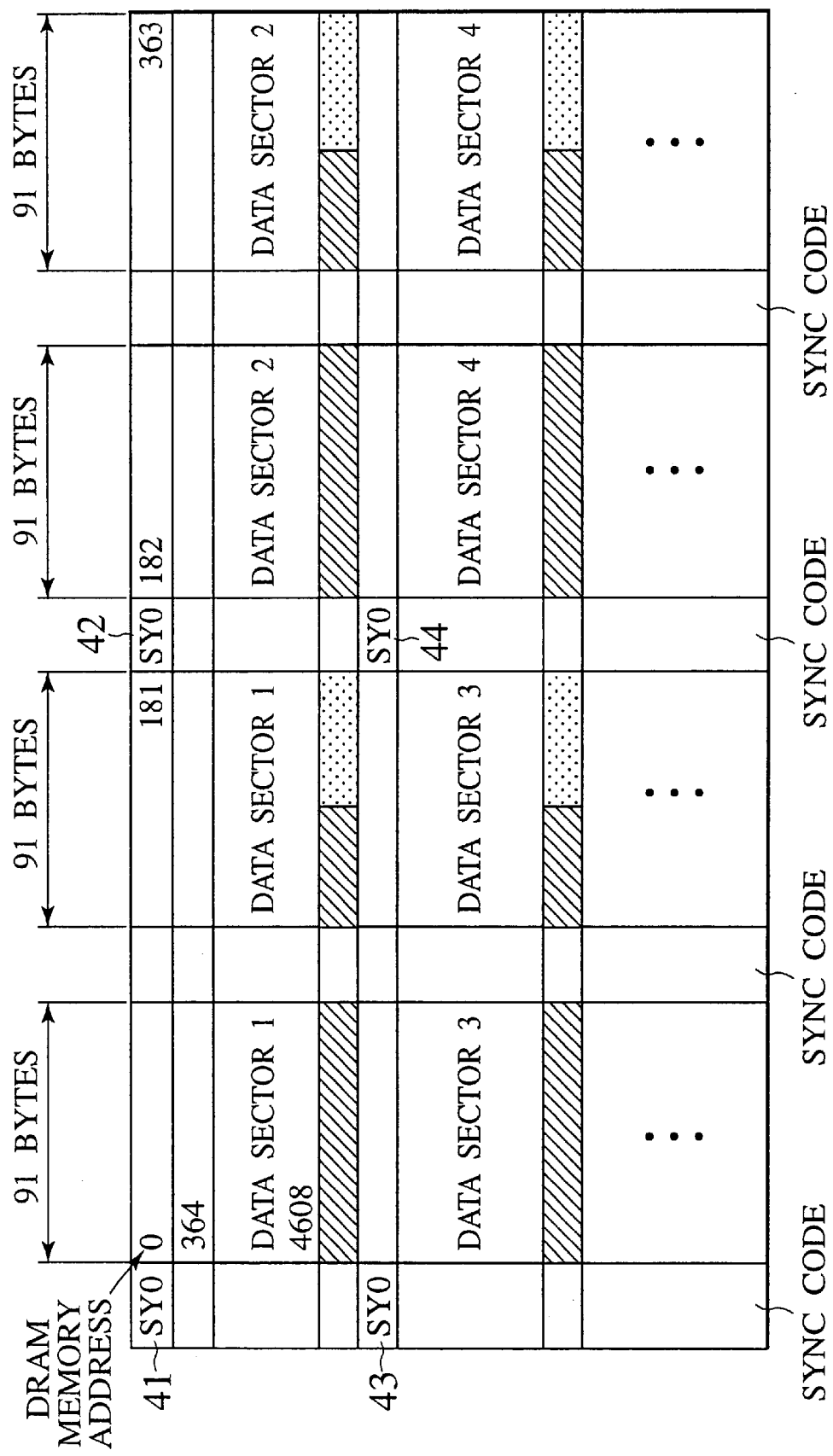
FIG. 8 is a diagram showing an example of the configuration of physical sectors in FIG. 5.

However, in the embodiment described above, the rows of two consecutive ECC blocks are recorded alternately on the optical disk 23 according to the memory map of the DRAM 19 such as the one shown in (B) in FIG. 6. Therefore, if the unique sync code is used only in the first frame of a sector as on a DVD, SY0 is not generated at a fixed frequency in the physical sectors of the signals recorded on the optical disk 23 as shown in FIG. 8. It should be noted that the sync code itself is not stored in the DRAM 19 but is added by the modulation and frame sync adding unit 20 at a 91-byte interval and then recorded on the optical disk 23.

That is, when protection is provided beginning with the start of two ECC blocks as shown in FIG. 8, the sync frame SY0 appears at the start of data sector 1 indicated by 41, then, after two sync frames, the sync frame SY0 appears at the start of data sector 2 indicated by 42, then, after 50 sync frames, the sync frame SY0 appears at the start of data sector 3 indicated by 43, and then, after two sync frames, the sync frame SY0 appears at the start of data sector 4 indicated by 44. Thereafter, the interval between two sync frames (SY0) alternates between two and 50.

In this case, it must be decided which of two ECC blocks the detected SY0 belongs to. To do so, it is necessary, after detecting the SY0 normally, to use two counters at the same time where two values are stored, one for SY0 that is two sync frames ahead and the other for SY0 that is 50 sync frames ahead, in order to judge which will come next. However, this method makes the circuit complicated.

Figure 9:
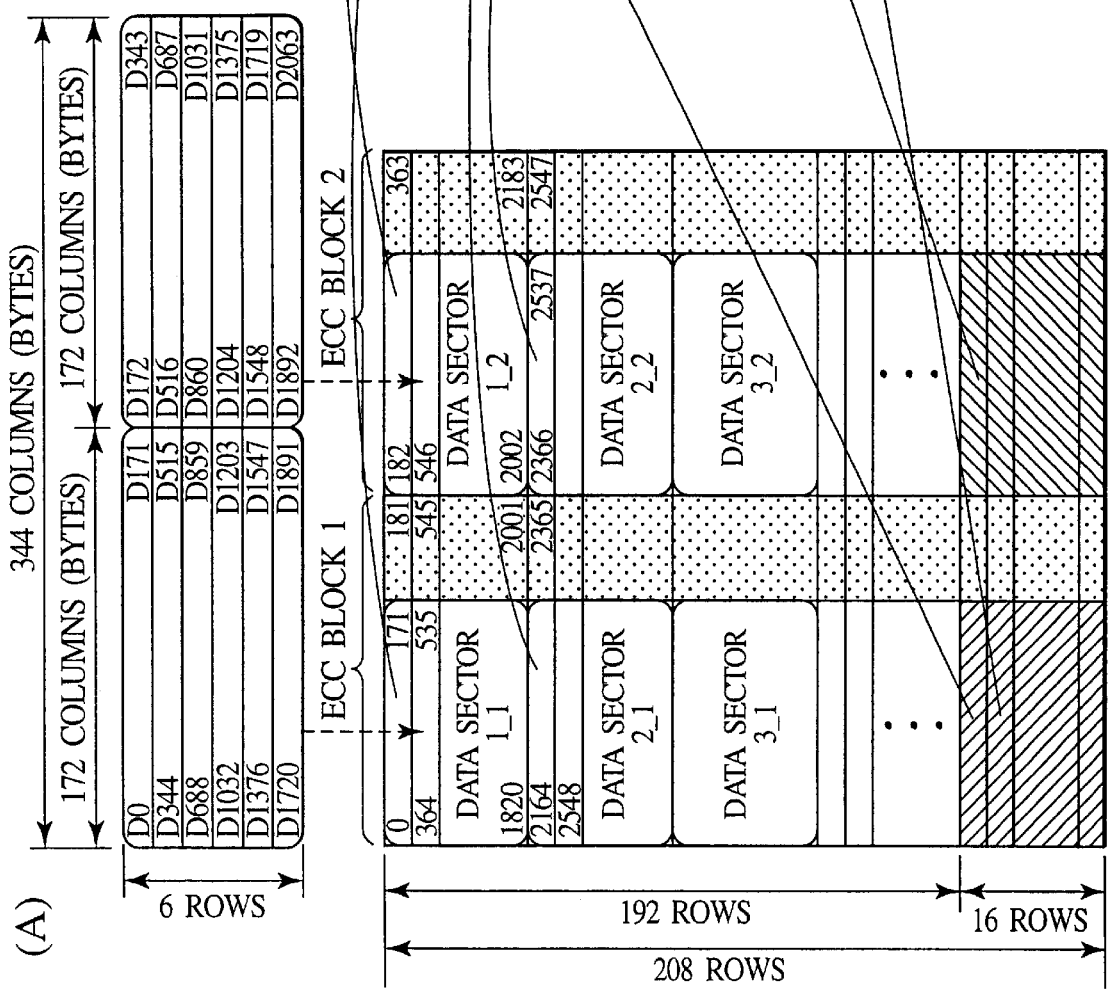
FIG. 9 is a diagram showing another example of a memory map of two memories, one before interleaving and the other after interleaving, of the recording system in FIG. 5.

Thus, in this embodiment, 2060 bytes of data composed of main data, ID, IED, and CP are written in the SRAM 12 such that the allocation is as shown in the memory map in (A) in FIG. 9. Then, the EDC encoder 14 reads data to generate a four-byte EDC and writes it in the SRAM 12. It should be noted that, as shown in (A) in FIG. 9, a data sector, 6×344, is divided into two in the column direction and that an area is reserved in the SARM for ECC-PI parity data which will be generated later.

That is, a 12×172 data sector shown in FIG. 7 is divided into two as shown in (A) in FIG. 9: a 6×172 first divided data sector (i_1 for ith data sector) composed only of odd-numbered rows and a 6×172 second divided data sector (i_2 for ith data sector) composed only of even-numbered rows. The divided data sectors on the left hand side form ECC block 1, while the divided data sectors on the right hand side form ECC block 2.

After 192 rows for 32 sectors (192 rows, 16 sectors×2) are generated as shown in (A) in FIG. 9, the scrambler 15 scrambles main data as in the example described above and writes scrambled data in the SRAM 12. Next, the ECC-PO encoder 16 reads 192 rows (bytes) of data from the SRAM 12 in the column direction, generates 16 bytes of PO parity data, and writes it in the PO parity area in the SRAM 12. This is repeated for 344 columns (=172 columns×2). Then, the ECC-PI encoder 17 reads 172 columns (bytes) of data from the SRAM 12 in the row direction as shown in (A) in FIG. 9, generates 10 bytes of PI parity data, and writes it in the parity area of the SRAM 12. This is repeated for 416 rows (208 rows×2).

The above operation generates two ECC blocks, that is, first ECC block 1 on the left-hand side and second ECC block on the right-hand side, as shown in (A) in FIG. 9. As in the above example, the sector address is incremented by one for each of consecutive data sectors.

Next, the interleave processor 18 reads data from the SRAM 12 and writes it into the DRAM 19 while interleaving as shown in (B) FIG. 9. Data is interleaved by adding the rows of the ECC blocks alternately as described above; that is, the first row of the first ECC block is read, then the first row of the second ECC block is read, then the second row of the first ECC block is read, then the second row of the second ECC block is read, and so on. The PO rows of the two ECC blocks are inserted, one PO row (182 bytes) of one of two ECC blocks every 12 rows (six rows×2).

The above operation accumulates data as shown in the memory map of the DRAM 19 in (B) in FIG. 9. Apparently, the memory map in (A) in FIG. 9 looks almost the same as that in (B), and data in the SRAM 12 and data in the DRAM 19 do not seem to be interleaved. However, interleaving in this context refers to the relation between data in ECC blocks and data written on the optical disk 23. Because data is written on the disk across ECC blocks, it can be said that data is interleaved.

Figure 10:
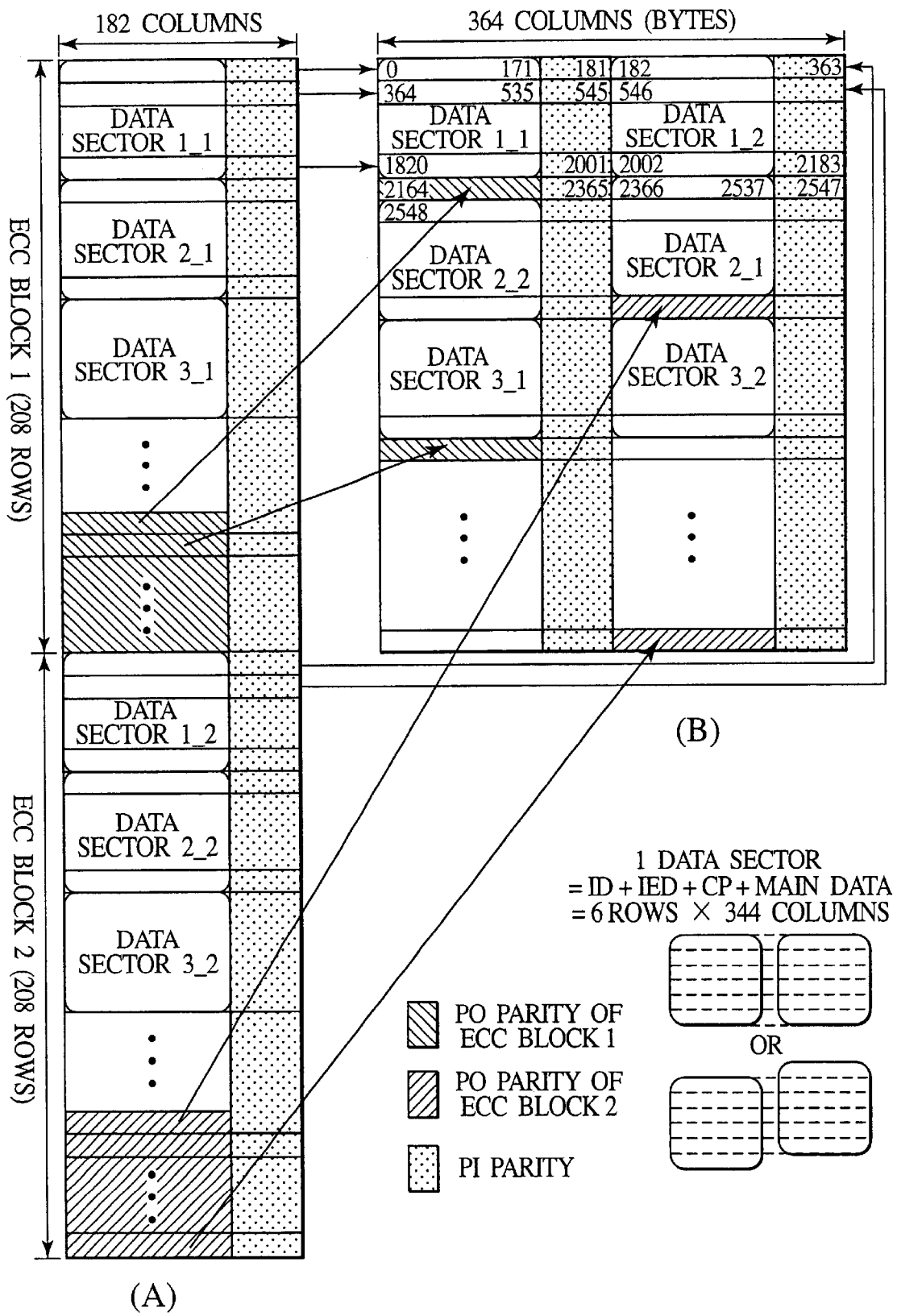
FIG. 10 is a diagram showing another representation of the memory map of two memories in FIG. 9.

FIG. 10 shows a memory map created from the memory map in FIG. 9 to make interleaving easy to understand. Both memory maps are equivalent. Section (A) in FIG. 10 is the memory map of the SRAM 12. In the memory map, the first ECC block is composed of 208 rows×182 columns including 32 6×172 first divided data sectors, 16×172 PO parity data, and 208×10 PI parity data. Similarly, the second ECC block is composed of 208 rows×182 columns including 32 second divided data sectors. The contents are the same as those in (A) in FIG. 9. The data in this SRAM is interleaved into the memory map of the DRAM 19 as shown in (B) in FIG. 10. The memory map in (B) in FIG. 10 is the same that in (B) in FIG. 9.

The interleaved data read sequentially from the DRAM 19 is modulated in the manner described above, has a frame synch code attached every 91 bytes, and is NRZI-converted for recording on the optical disk 23.

Figure 12:
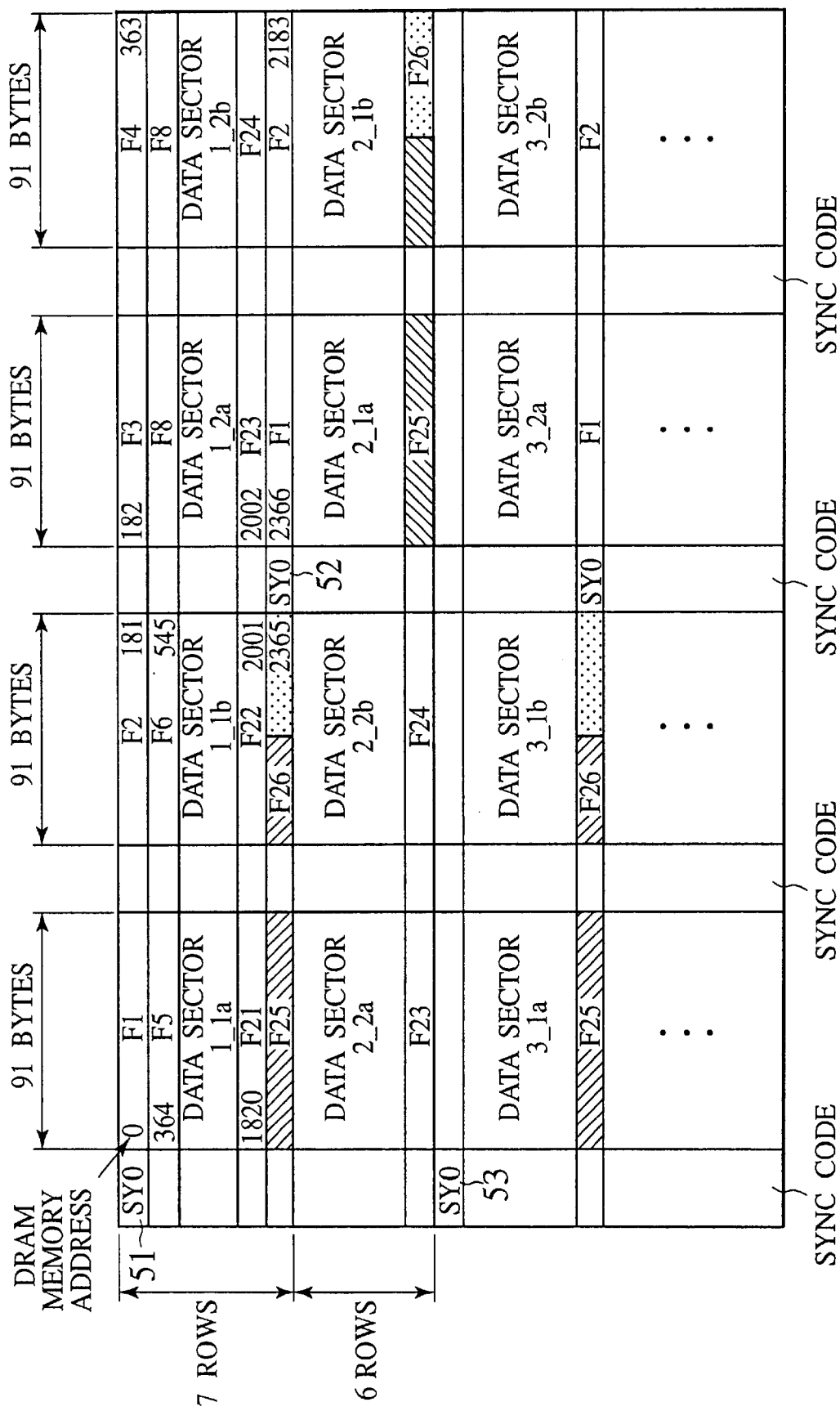
FIG. 12 is a diagram showing an example of the configuration of physical sectors in FIGS. 9 and 10.

FIG. 12 shows how physical sectors, including data and frame sync codes, are recorded on the optical disk 23. The sync frame SY0, indicated by 51, 52, and 53, at the start of a sector is allocated at a regular interval of 26 sync frames. In FIG. 12, Fn is a relative frame number. Also, data sector 1_1a corresponds to the first-half 91 columns (bytes) of data sector 1_1 in each (B) in FIG. 9 and FIG. 10, and data sector 1_b corresponds to the last-half 81 columns (bytes) of data sector 1_1 and 10 bytes of PI parity data. Other data sectors are allocated in the same way. Because the sync frame SY0 may be recorded and reproduced at a regular interval in this way, sector synchronization may be established at reproduction time with a simple circuit.

The reproduction operation in this case is similar to that of the configuration in FIG. 8 described above. The following describes the operation simply. Each time at least one row (182 bytes) of data is accumulated in the SRAM 29, the ECC-PI corrector 30 in FIG. 5 reads data from the SRAM 29 in the row direction, corrects an error with PI parity data if any, and writes corrected data into the SRAM 29. After PI correction is made for all rows in the two consecutive ECC blocks and corrected data is written in the SRAM 29, the ECC-PO corrector 31 starts PO correction.

The ECC-PO corrector reads 208 bytes of data from the SRAM 29 in the column direction of the memory map to perform PO correction with PO parity data for all columns of two ECC blocks, that is, 364 columns (=182 columns×2). After that, sector data extending across two ECC blocks (that is, 2064 bytes composed of the ID, IED, CP, main data, and EDC parity data) is sequentially accessed and then data is read from the SRAM 29.

In the above description, a 12×172 data sector is used as an example. With a data sector given as an M×N data sector, the data sector may be divided into two in the column direction to generate a first divided data sector and a second divided data sector, each composed of M rows and N/2 columns. When data is interleaved, one PO row of one of two ECC blocks is inserted each time M rows (each data sector) are output from the first divided data sector and the second divided data sector. In other words, a data sector, given as an R(=M×2)×C(=N/2) data sector, is divided into two to generate an (R/2)×C first divided data sector composed of odd-numbered rows and an (R/2)×C second divided data sector composed of even-numbered rows. When data is interleaved, one PO row of one of two ECC blocks is inserted each time (R/2) rows (each data sector) are output from the first divided data sector and the second divided data sector.

<Second Embodiment>

Figure 13:
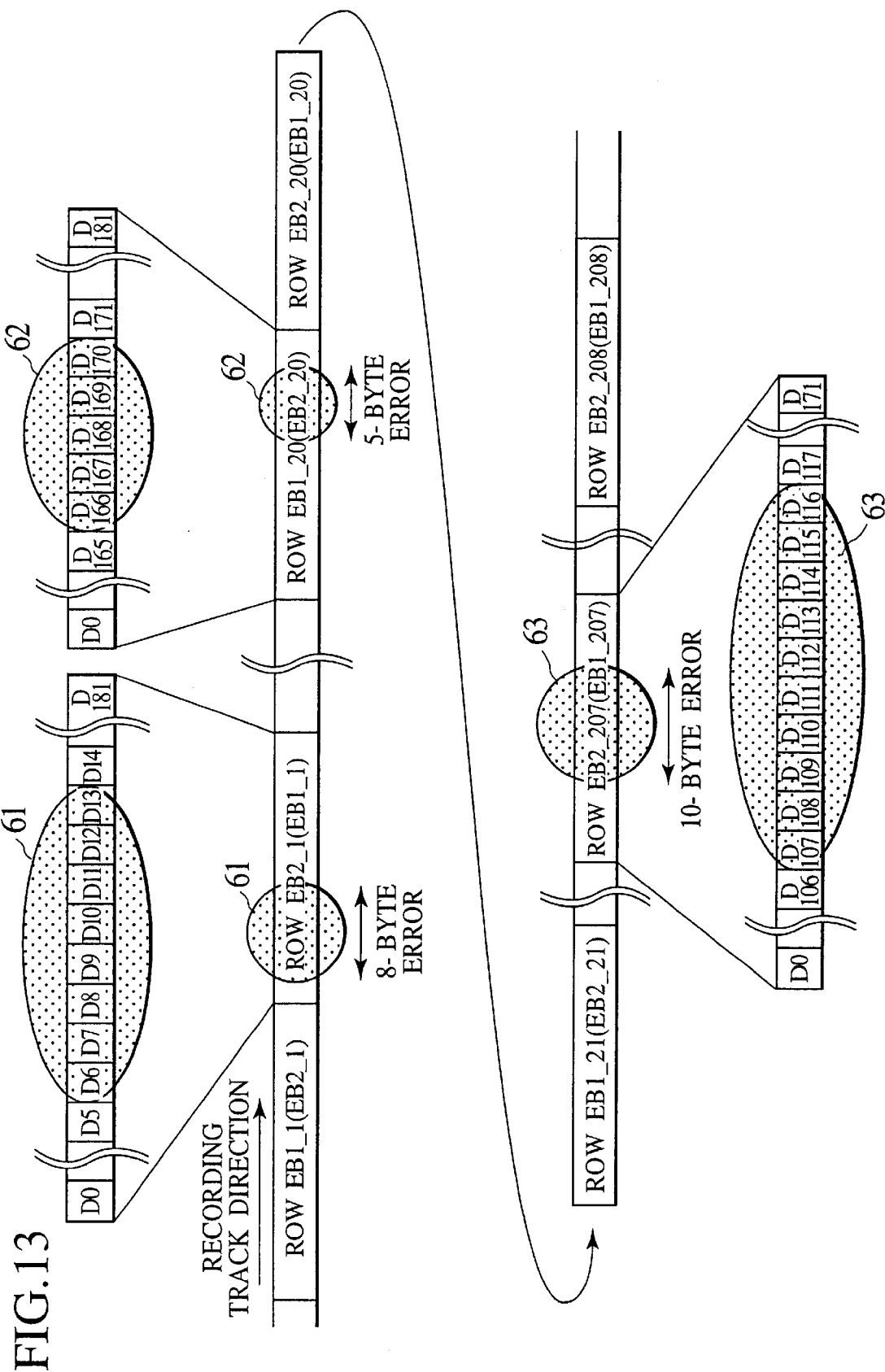
FIG. 13 is a diagram showing data allocation on a data recording medium in a second embodiment of the present invention.

Next, a second embodiment of the present invention will be described. FIG. 13 shows data allocation on a recording medium in the second embodiment of the present invention. In this embodiment, an interleave method is used in which data, which is error-correction-coded by the product coding method, is distributed on a recording medium. As shown in FIG. 13, with two consecutive product-coded ECC blocks, EB1 and EB2, as a set, the first byte in the first row of the first ECC block EB1 is followed by the second byte in the first row of the second ECC block EB2, which is followed by the third byte in the first row of the first ECC block EB1, which is followed by the fourth byte in the first row of the second ECC block EB2. In this way, an odd-numbered byte in the first row of the first ECC block is followed by an even-numbered byte in the first row of the second ECC block EB2. This sequence is repeated until the end of the first row. In FIG. 13, this data combination is represented as EB1_1(EB2_1).

Because an ECC block is composed of 208 rows (bytes) each composed of 182 columns (bytes) as described above, the 181st byte in the first row of the first ECC block EB1 is followed by the 182nd byte in the first row of the second ECC block EB2. Then, the first byte in the first row of EB2 is followed by the second byte in the first row of EB1. In the same way, an odd-numbered byte of EB2 is followed by an even-numbered byte of EB1, and this is repeated on a byte basis until the end of the first row. In FIG. 13, this data combination is represented as EB2_1(EB1_1).

Next, the same data allocation is performed for the second rows of EB1 and EB2. That is, kth byte of one of the ECC blocks is followed by the (k+1)th byte of the other ECC block on a byte basis until the end of the second row. Data is allocated in this sequence for all rows of EB1 and EB2.

As in the first embodiment, the PO parity data of the two ECC blocks is read, one row for each sector of the ECC blocks. For example, after the last byte (that is, 182nd byte) in the last row of the first sector of the first ECC block EB1 is read, the first byte in the first PO parity row of the first ECC block EB1 is read and then the second byte in the first PO parity row of the second ECC block EB2 is read. By reading data as described above, data is written in the memory of the recording system (DRAM 19 in FIG. 5) of the data recording and reproducing apparatus in the same order in which data is stored in the array on the optical disk shown in FIG. 13.

Although data is interleaved when read from the SRAM in this embodiment, data may also be interleaved when written into the DRAM. In addition, data may be interleaved when written into the SRAM, and the EDCs and ECCs may be generated by reading the data while de-interleaving it.

When making PI corrections in the optical disk reproduction system in this embodiment, PI error correction processing is performed twice each time two rows from the two ECC blocks (182 bytes×2), one from each, are written in the memory (corresponds to SRAM 29 in FIG. 5). PO corrections are made after PI corrections are made for all rows of the two ECC blocks as in the first embodiment.

Assume that a relatively short burst error has occurred in three positions when an optical disk is reproduced in the second embodiment. The errors are an eight-byte error at a position indicated by 61, a five-byte error at a position indicated by 62, and a 10-byte error at a position indicated by 63, respectively, in FIG. 13.

Figure 14:
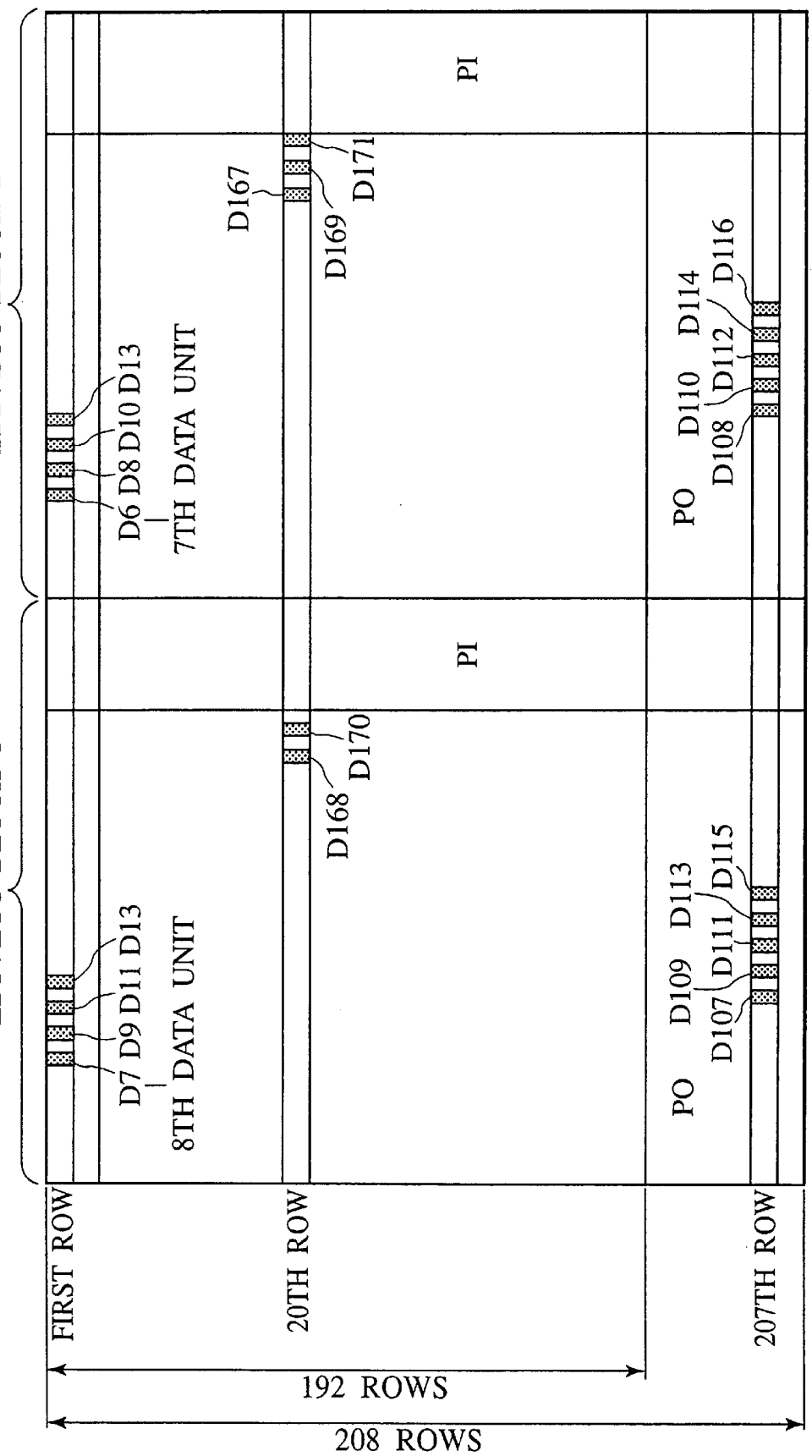
FIG. 14 is a diagram showing the distribution of errors in the ECC blocks after de-interleaving at reproduction time in the data shown in FIG. 13.

FIG. 14 shows the error distribution of de-interleaved data at reproduction time. If data bytes were not replaced on a byte basis at recording time, the errors would remain in the rows. On the other hand, in this embodiment, burst errors are distributed between two ECC blocks. The first ECC block EB1 includes four bytes of error, two bytes of error, and five bytes of error, while the second ECC block includes four bytes of error, three bytes of error, and five bytes of error, respectively. If the number of bytes of an error is odd as in the five-byte burst error in the 20th row, the number of error in one ECC block is one byte longer than that of the corresponding error in the other ECC block. Dn in FIGS. 13 and 14 indicates a relative data number in each row.

As described above, the PI parity data on a DVD is 10 bytes long, meaning that five symbols (bytes) may usually be corrected. Therefore, in the conventional method in which data bytes are not replaced on a byte basis at recording time, the five-byte error in the above example can be corrected but the remaining eight-byte error and the 10-byte error cannot. On the other hand, because the number of bytes of a relatively short burst error included in a row in each ECC block may be reduced to about ½ in this embodiment, the eight-byte error and 10-byte error in the above example are distributed between two ECC blocks as four bytes of error and five bytes of error. Therefore, all errors may be corrected In this embodiment, the length of a relatively short burst error included in each ECC block may be reduced to about ½. As described above, if there is no random error, the maximum length of a correctable burst error in the conventional DVD format is about 10 μm. Therefore, when the linear density is doubled, the maximum length of a defect correctable with PI parity data is about 5 μm. On the other hand, because a burst error about two times in length may be corrected in this embodiment, the maximum length of a defect correctable with PI data is about 10 μm even if the linear density is doubled. For the linear density of a DVD, a burst error in about up to 20 μm may be corrected with PI data.

If a relatively short burst error occurs in the same row of the two ECC blocks, the number of error bytes in the rows is averaged in this embodiment. Therefore, the probability with which an uncorrectable error occurs is lowered.

In this embodiment, the PO parity rows of the two ECC blocks are read, one row for each sector of the ECC blocks. Instead, with a 6×344 data sector divided into two (that is, the first divided data sector and the second divided data sector) for distribution data to two ECC blocks as shown in (A) in FIG. 9, data may be interleaved in such a way that the PO rows of both ECC blocks (=182 bytes×2) are inserted every two data sectors, that is, every 24 rows (12 rows of the first divided data sector and 12 rows of the second divided data sector), and then interleaving in the second embodiment is performed. This allows main data to be orderly sequenced on a recording medium in the second embodiment, making memory access at reproduction time easy.

In addition, with a 6×344 data sector divided into two (that is, the first divided data sector and the second divided data sector) for distribution data to two ECC blocks as shown in (A) in FIG. 9, data may be interleaved in such a way that one PO row of one of two ECC blocks is inserted for each data sector, that is, every 12 rows (six rows of the first divided data sector and six rows of the second divided data sector) and then interleaving in the second embodiment is performed. This allows the unique sync frame SY0 to be recorded at the start of a physical sector at a fixed frequency.

The present invention is not limited to the above embodiments. For example, although two types of product code, PI parity and PO parity, are used in the embodiments, the present invention is also applicable when three or more types of product code are used.

Although the two corresponding rows in two product code blocks (EB1 and EB2) are alternately switched every byte in the second embodiment, the rows may also be switched alternately every 2 bytes, 13 bytes, 14 bytes, or 91 bytes that are prime numbers of 182 bytes that form one row. The fewer the number of bytes, the more enhanced the ability to correct relatively short burst errors. In addition, the interleaved digital signal in each embodiment may be transmitted in the wired or wireless mode or distributed over the Internet.

As described above, the method according to the present invention reproduces data from a recording medium on which the kth rows of at least two ECC blocks are sequentially recorded, which are followed sequentially by the (k+1)th rows, for all rows of the ECC blocks repeatedly. Therefore, if a serious burst error spanning two ECC blocks occurs, data reproduced from the recording medium that contains the error is distributed between two or more ECC blocks and therefore the size of the error included in one ECC block is reduced to ½ or smaller as compared to that of the conventional method. Also, because the parity data is recorded in a unique allocation method without increasing the number of parity words, the maximum burst-error correctable length may be increased in a simple configuration without increasing redundancy. This is very efficient for increasing the data linear density.

In addition, with the consecutive two ECC blocks as a set, data is recorded on a recording medium in such a way that the odd-numbered data unit in the first row of one of the ECC blocks and the even-numbered data unit in the first row of the other ECC block are alternately switched on a data unit basis. Then, the even-numbered data unit in the first row of one of the ECC blocks and the odd-numbered data unit in the first row of the other ECC block are alternately switched on a data unit basis. This is repeated for all rows in the two ECC blocks. Therefore, if a relatively small error occurs, the burst error length may be averaged in the corresponding rows and the probability with which an uncorrectable error occurs becomes lower than that of the conventional apparatus. Thus, the apparatus according to the present invention is very efficient for increasing the data linear density.

It should be understood that many modifications and adaptations of the invention will become apparent to those skilled in the art and it is intended to encompass such obvious modifications and changes in the scope of the claims appended hereto.

What is claimed is:

1. A digital signal processing method for recording and reproducing digital signals of data to and from a recording medium on an ECC block basis, said ECC block including a predetermined number of words of digital signals and parity data generated by product-coding the predetermined number of words of digital signals, wherein, with two consecutive ECC blocks as a set, a sequence of operations is repeated for all rows of the two ECC blocks of the set, said sequence of operations being executed in such a way that positions of an odd-numbered data unit in a first row of one of the ECC blocks of the set and an even-numbered data unit in a first row of the other ECC block are exchanged on a data unit basis and recorded on the recording medium and then positions of an even-numbered data unit in the first row of one of the ECC block and an odd-numbered data unit in the first row of the other ECC block are exchanged on a data unit basis and recorded on the recording medium.

2. A data recording and reproducing apparatus that records and reproduces digital signals of data to and from a recording medium on an ECC block basis, said ECC block including a predetermined number of words of digital signals and parity data generated by product-coding the predetermined number of words of digital signals, said apparatus comprising:

ECC block generating means for generating ECC blocks by a product-coding method, each ECC block including a predetermined number of words of main data, auxiliary information including a sector address, and parity data;

interleaving means for sequentially outputting, with n (n≧2) consecutive ECC blocks as a set, kth rows and then (k+1)th rows of the ECC blocks of the set in such a way that first rows of the ECC blocks of the set are output sequentially and then second rows are output sequentially, said consecutive ECC blocks being included in the ECC blocks generated by said ECC block generating means;

recording means for recording signals, output by said interleaving means, on said recording medium with frame sync codes attached;

reproducing means for reproducing the signals from said recording medium;

de-interleaving means for de-interleaving the signals reproduced by said reproducing means based on the sector addresses and for outputting said ECC blocks arranged in an original order; and decoding means for decoding the main data using data in the ECC blocks obtained by said de-interleaving means wherein said ECC block generating means sequentially generates a plurality of ECC blocks each composed of a predetermined number of words and each comprising a plurality of divided data sectors each being one of two M×(N/2) data sectors generated by dividing an M×N data sector composed of the main data and the auxiliary information, into two in a column direction; a predetermined number of bytes of first parity data generated from row-direction elements of the plurality of divided data sectors; and a predetermined number of bytes of second parity data generated from column-direction elements of the plurality of divided data sectors, the first parity data or the second parity data being generated from the row-direction elements of the second parity data or the column-direction elements of the first parity data, wherein, with two consecutive ECC blocks, generated by said ECC block generating means, as a set, said interleaving means sequentially outputs kth rows, and then sequentially outputs (k+1) th rows, of two divided data sectors corresponding to each of the ECC blocks in such a way that each of first rows of the two divided data sectors, each belonging to one of the ECC blocks of the set, and corresponding first parity data are output sequentially and then each of second rows is output sequentially and, each time M rows of the two divided data sectors are output, the second parity data is output alternately for one and the other of the two ECC blocks alternately, and wherein said recording means records the signals, output by said interleaving means, with the frame sync codes attached at a regular interval.

3. A data recording and reproducing apparatus that records and reproduces digital signals of data to and from a recording medium on an ECC block basis, said ECC block including a predetermined number of words of digital signals and parity data generated by product-coding the predetermined number of words of digital signals, said apparatus comprising:

ECC block generating means for generating ECC blocks by a product-coding method, each ECC block including a predetermined number of words of main data, auxiliary information including a sector address, and parity data;

interleaving means for sequentially outputting, with n (n≧2) consecutive ECC blocks as a set, kth rows and then (k+1) th rows of the ECC blocks of the set in such a way that first rows of the ECC blocks of the set are output sequentially and then second rows are output sequentially, said consecutive ECC blocks being included in the ECC blocks generated by said ECC block generating means;

recording means for recording signals, output by said interleaving means, on said recording medium with frame sync codes attached;

reproducing means for reproducing the signals from said recording medium;

de-interleaving means for de-interleaving the signals reproduced by said reproducing means based on the sector addresses and for outputting said ECC blocks arranged in an original order; and decoding means for decoding the main data using data in the ECC blocks obtained by said de-interleaving means, wherein said ECC block generating means sequentially generates a plurality of ECC blocks each composed of a predetermined number of words and each comprising a plurality of divided data sectors each being one of two M×(N/2) data sectors generated by dividing an M×N data sector composed of the main data and the auxiliary information, into two in a column direction; a predetermined number of bytes of first parity data generated from row-direction elements of the plurality of divided data sectors; and a predetermined number of bytes of second parity data generated from column-direction elements of the plurality of divided data sectors, the first parity data or the second parity data being generated from row-direction elements of the second parity data or column-direction elements of the first parity data, wherein, with two consecutive ECC blocks, generated by said ECC block generating means, as a set, said interleaving means sequentially outputs kth rows, and then sequentially outputs (k+1)th rows, of two divided data sectors corresponding to each of the ECC blocks in such a way that each of first rows of the two divided data sectors, each belonging to one of the ECC blocks of the set, and corresponding first parity data are output sequentially and then each of second rows is output sequentially and, each time (2×M) rows of the two divided data sectors are output, the second parity data is output for the two ECC blocks.

4. A data recording and reproducing apparatus that records and reproduces digital signals of data to and from a recording medium on an ECC block basis, said ECC block including a predetermined number of words of digital signals and parity data generated by product-coding the predetermined number of words of digital signals, said apparatus comprising:

ECC block generating means for generating ECC blocks by a product-coding method, each ECC block including a predetermined number of words of main data, auxiliary information including a sector address, and parity data;

interleaving means for repeating, with two consecutive ECC blocks as a set, a sequence of operations for all rows of the two ECC blocks of the set, said sequence of operations being executed in such a way that positions of an odd-numbered data unit in a first row of one of the ECC blocks of the set and an even-numbered data unit in a first row of the other ECC block are exchanged on a data unit basis and then positions of an even-numbered data unit in the first row of one of the ECC block and an odd-numbered data unit in the first row of the other ECC block are exchanged on a data unit basis;

recording means for recording signals, output by said interleaving means, on said recording medium with frame sync codes attached;

reproducing means for reproducing the signals from said recording medium;

de-interleaving means for de-interleaving the signals reproduced by said reproducing means based on the sector addresses and for outputting said ECC blocks arranged in an original order; and decoding means for decoding the main data using data in the ECC blocks obtained by said de-interleaving means.

5. A recording medium on which digital signal of data are recorded on an ECC block basis, said ECC block including a predetermined number of words of digital signals and parity data generated by product-coding the predetermined number of words of digital signals, wherein, with two consecutive ECC blocks as a set, a sequence of operations is repeated for all rows of the two ECC blocks of the set, said sequence of operations being executed in such a way that positions of an odd-numbered data unit in a first row of one of the ECC blocks of the set and an even-numbered data unit in a first row of the other ECC block are exchanged on a data unit basis and then positions of an even-numbered data unit in the first row of one of the ECC block and an odd-numbered data unit in the first row of the other ECC block are exchanged on a data unit basis.

* * * * *